(12) United States Patent
Araki et al.

(10) Patent No.: US 7,043,704 B2
(45) Date of Patent: May 9, 2006

(54) METHODS AND APPARATUS FOR VERIFYING CIRCUIT BOARD DESIGN

(75) Inventors: Kenji Araki, Saitama (JP); Ayao Yokoyama, Nagano (JP)

(73) Assignee: Sony Corporation, Tokyo (JP)

( * ) Notice: Subject to any disclaimer, the term of this patent is extended or adjusted under 35 U.S.C. 154(b) by 265 days.

(21) Appl. No.: 10/458,973

(22) Filed: Jun. 11, 2003

(65) Prior Publication Data

US 2004/0003358 A1    Jan. 1, 2004

(30) Foreign Application Priority Data

Jun. 28, 2002    (JP) .............................. 2002-190857

(51) Int. Cl.
| G06F 17/50 | (2006.01) |
| G06F 19/00 | (2006.01) |
| G01R 31/08 | (2006.01) |

(52) U.S. Cl. .............................. 716/5; 716/15; 702/64; 702/66; 702/120; 324/522; 714/43; 714/32

(58) Field of Classification Search ............... 716/5, 716/15; 702/64, 66, 120; 324/522; 714/43, 714/32

See application file for complete search history.

(56) References Cited

U.S. PATENT DOCUMENTS

| 5,546,321 | A  | * | 8/1996  | Chang et al. ................. 716/1   |
| 5,608,245 | A  | * | 3/1997  | Martin ....................... 257/291 |
| 6,449,568 | B1 | * | 9/2002  | Gerrish ........................ 702/60 |
| 6,546,538 | B1 | * | 4/2003  | Rubdi et al. .................. 716/12  |
| 6,557,154 | B1 | * | 4/2003  | Harada et al. ................ 716/11   |
| 6,598,208 | B1 | * | 7/2003  | Sasaki et al. ................. 716/4   |
| 6,691,296 | B1 | * | 2/2004  | Nakayama et al. ........... 716/15     |
| 6,708,123 | B1 | * | 3/2004  | Gerrish ........................ 702/60 |
| 6,780,660 | B1 | * | 8/2004  | Hamamura et al. ........... 438/17     |

(Continued)

FOREIGN PATENT DOCUMENTS

JP    11317572 A    * 11/1999

(Continued)

OTHER PUBLICATIONS

Cui et al., "EMI Resulting from Signal Via Transitions Through the DC Power Bus", IEEE International Symposium on Electromagnetic Compatibility, vol. 2, Aug. 21, 2000, pp. 821-826.*

(Continued)

*Primary Examiner*—Matthew Smith
*Assistant Examiner*—Phallaka Kik
(74) *Attorney, Agent, or Firm*—Robert J. Depke; Trexler, Bushnell, Giangiorgi, Blackstone & Marr

(57) ABSTRACT

The present invention provides a method for verifying a design of a circuit board that has a wiring layer connecting components to be mounted, a power layer, and an insulating layer formed between the wiring layer and the power layer. According to this method, detection of chippings in the power layer is performed. The chipping is, for example, a gap, a slot, or a slit, and corresponds to one wiring layer and interrupts a region in which the wiring layer and the power layer are opposed to each other. When chippings are detected, a common-mode voltage expected to be caused owing to each of the chippings is computed. Subsequently, the position of the chipping and the value of the common-mode voltage caused owing to the chipping are outputted. Thus, the priorities of the chippings, to which countermeasure for suppressing radiation of electromagnetic waves should be applied, can easily be decided.

20 Claims, 12 Drawing Sheets

U.S. PATENT DOCUMENTS

| | | | | |
|---|---|---|---|---|
| 6,789,247 | B1* | 9/2004 | Etou | 716/15 |
| 6,847,853 | B1* | 1/2005 | Vinciarelli et al. | 700/97 |
| 6,895,346 | B1* | 5/2005 | Hamamura et al. | 702/58 |
| 2002/0157077 | A1* | 10/2002 | Etou | 716/15 |
| 2003/0046013 | A1* | 3/2003 | Gerrish | 702/60 |
| 2004/0128088 | A1* | 7/2004 | Laletin et al. | 702/64 |

FOREIGN PATENT DOCUMENTS

| | | | |
|---|---|---|---|
| JP | 2000183533 A | * | 6/2000 |
| JP | 2000216586 A | * | 8/2000 |
| JP | 2001127387 A | * | 5/2001 |
| JP | 2001331539 A | * | 11/2001 |
| JP | 2001-331539 | | 4/2002 |

OTHER PUBLICATIONS

Lin et al., "Composite Effects of Reflections and Ground Bounce for Signal Line Through a Split Power Plane", Eelectrical Performance of Electronic Packing, Oct. 29, 2001, pp. 89-92.*

Lin et al., "Composite Effects of Reflections and Ground Bounce for Signal Vias in Multi-layer Environment", Proceedings of 2001 Asia-Pacific Microwave Conference, vol. 3, Dec. 3, 2001, pp. 1127-1130.*

Norman et al., "Experimental and Simulation Analysis of Single and Differential Signals Changing Layers", 2001 IEEE International Symposium on Electromagnetic Compatibility, vol. 2, Aug. 13, 2001, pp. 1088-1091.*

Cui et al., "DC Power Bus Noise Isolation with Power Islands", 2001 IEEE International Symposium on Electromagnetic Compatibility, vol. 2, Aug. 13, 2001, pp. 899-903.*

Liaw et al., "Signal Integrity Issues at Split Ground and Power Planes", 1986 Proceedings of 46th Electronic Components and Technology Conference, May 28, 1996, pp. 752-755.*

Van den Berghe et al., "Study of the Ground Bounce Caused by Power Plane Resonances", IEEE Transactions on Electromagnetic Compatibility, vol. 40, No. 2, May 1998, pp. 111-119.*

Djordjevic et al., "An Investigation of Delta-I Noise on Integrated Circuits", IEEE Transactions on Electromagnetic Compatibility, vol. 35, No. 2, May 1993, pp. 134-147.*

Chun-Te Wu et al. "Composite Effects of Reflections and Ground Bounce for Signal Line Through a Split Power Plane" IEEE Transactions on Advanced Packaging IEEE USA, vol. 25, No. 2, May 2002, pp. 297-301.

Liaw H-J et al "Crossing the Planes at High Speed. Signal Integrity Issue at Split Ground and Power Planes" IEEE Circuits and Device Magazine IEEE USA, vol. 13, No. 6., Nov. 1997, pp. 22-26.

* cited by examiner

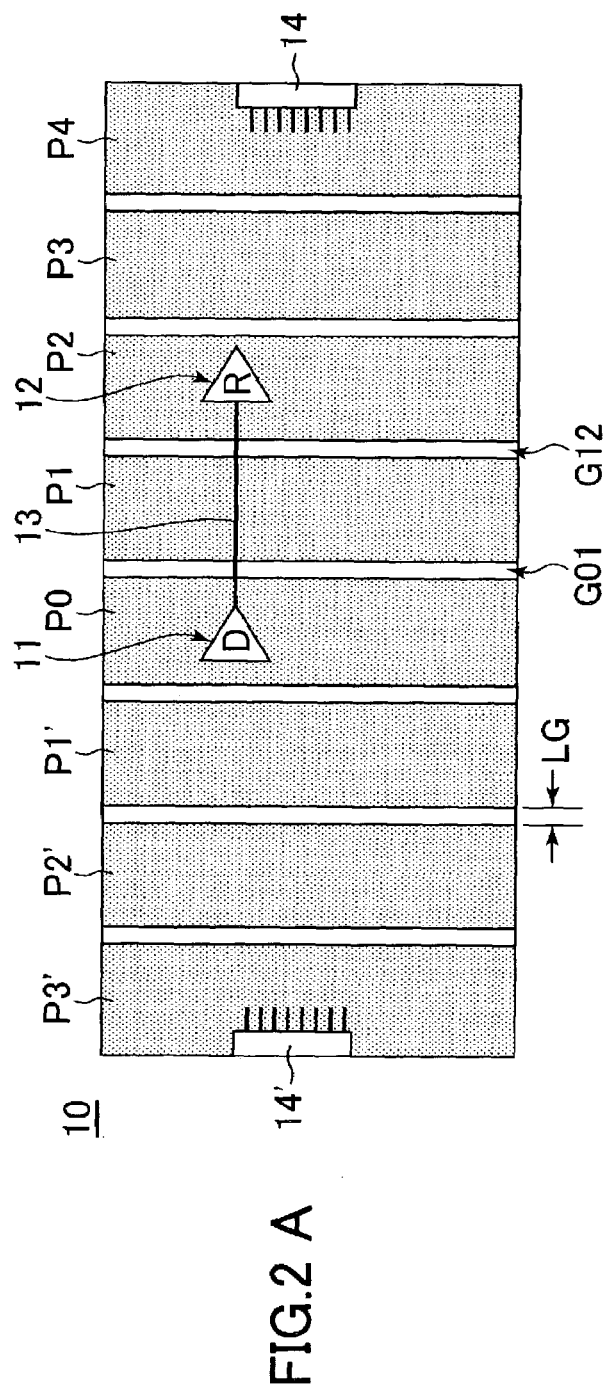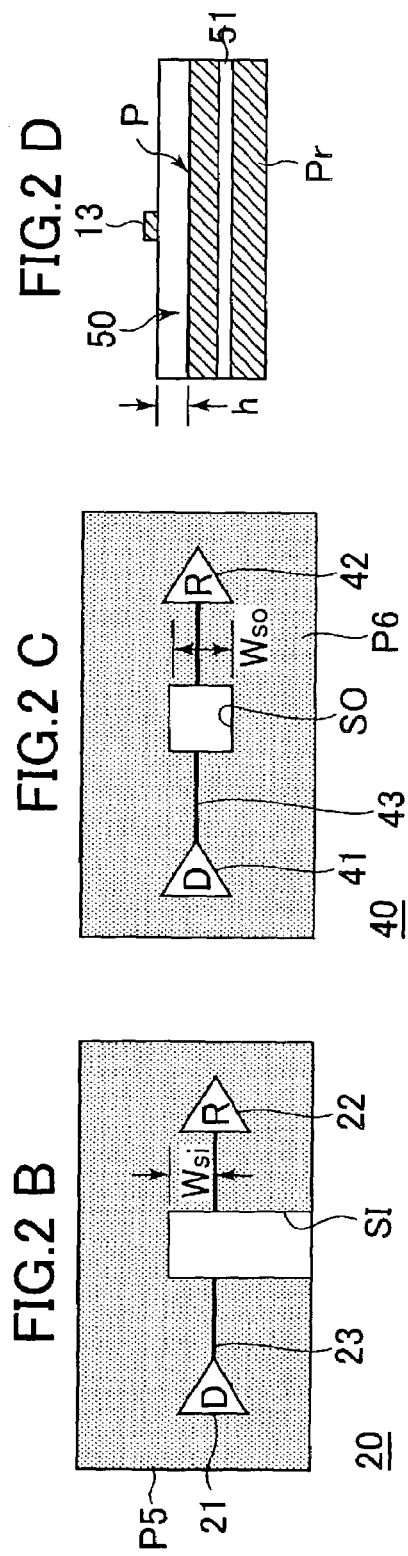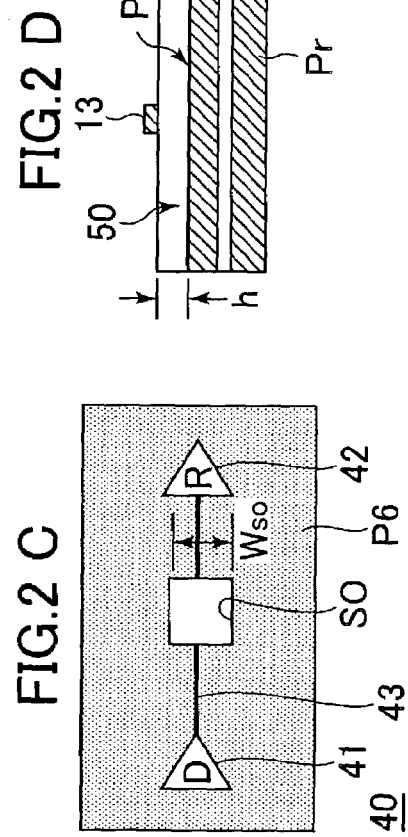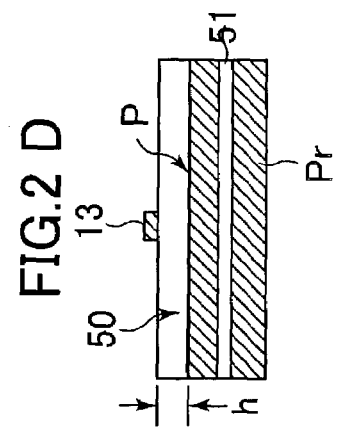
FIG. 2 A
FIG. 2 B
FIG. 2 C
FIG. 2 D

METHODS AND APPARATUS FOR VERIFYING CIRCUIT BOARD DESIGN

CROSS REFERENCES TO RELATED APPLICATIONS

The present document is based on Japanese Priority Document JP 2002-190857, filed in the Japanese Patent Office on Jun. 28, 2002, the entire contents of which being incorporated herein by reference.

BACKGROUND OF THE INVENTION

1. Field of the Invention

The present invention relates to a method and an apparatus for verifying influence of chippings, which are caused in a power supply layer, on electromagnetic wave radiation in a circuit board in which a wiring layer between components to be mounted faces the power supply layer through an insulating layer intervening between the wiring layer and the power supply layer.

2. Description of Related Art

A printed circuit board for use in recent electronic equipment is provided with conductive layers, to each of which a plurality of power supply voltages are applied, and conductive layers to be separated according to power supply voltages from each other and to be held at a common potential. In the specification, these conductive layers will be referred to as power layers. In the printed circuit board, an insulating layer separates the power layer from the wiring layer. For example, a uniform-thickness insulating layer is disposed between a signal line and the power layer in a microstrip-line structure.

The power layer to which a supply voltage is applied, (hereunder referred to as the supply voltage plate), is under layout restrictions that a plurality of power layers are efficiently disposed, and that the power layer should be disposed in such a way as to avoid via-forming regions. Thus, chippings, such as "gaps", "slots" and "slits" are often formed in the power layer. Incidentally, the "chippings" are defined herein as chipped-off parts of a power layer, which correspond to one signal line and interrupt regions each containing a wiring layer and a power layer that are opposed to each other. Therefore, a part, in which a power layer is partly absent, at a place, in which no signal line faces the power line, does not belong to the category of the chipping. The "gaps" are defined herein as chippings in a power layer, which are affected mainly by the length in the wiring direction of the signal line. Usually, the clearance between two power layers is referred to as the "gap". In a case where a signal line intersects with a part sufficiently away from both ends of an elongated opening portion formed in one power layer, this opening portion is also regarded for the signal line as a "gap" Conversely, in a case where the end portions of an opening portion formed in a power layer are disposed closely to both sides in the direction of width of a signal line, respectively, and that both the end portions thereof affect the signal line, this opening portion is referred to as a "slot". In a case where only one of end portions of an opening portion formed therein is close to a signal line and affects signal line, this opening portion is referred to as a "slit".

Implementation of wiring design for separating ground plates of an analog circuit and a digital circuit from each other or avoiding the power layers to be disposed in via-forming regions sometimes results in formation of gaps at initially unexpected parts owing to requirements concerning power layers (hereunder referred to as "common potential plates") held at common potential, which are, for example, that the ground plates of an analog circuit and a digital circuit are separated from each other and that the power layers should be disposed in such a manner as to avoid via-forming regions.

It is known that when a signal line is present in such a way as to intersect with a gap, the intensity of electromagnetic wave radiation from the signal line increases as a result of a fact that a power supply plate (that is, a supply voltage plate or a common potential plate) opposed to the signal line is missing at an intersection part. This is caused by a fact that a return path of current flowing through the signal line becomes away therefrom.

A method of connecting the plates, which are spaced with a gap, to each other by an electric conductor so as to reduce the influence of chippings (mainly including a gap) of the power supply plate opposed to the signal line is known as a measure for restraining unnecessary electromagnetic wave radiation.

However, even when this measure is used, it is frequent that the plates cannot be connected to each other by an electric conductor, for instance, in a case that different voltages are actually applied to between the power supply plates. Although electromagnetic wave radiation is reduced when dimensions of the gap are small, it is not easily determined what dimensions of the gap are sufficient to reduce the electromagnetic wave radiation to an extent that resultant electromagnetic wave radiation is small enough to be ignored. It takes much time and effort to find a gap by visual inspection in a miniaturized high-density mounting printed circuit board. It is highly likely to overlook the gap.

Japanese Patent Application Publication Laid-Open No. 2001-331539 proposes a method of using simple computational expressions to verify whether or not a signal line transversing a target opening portion (that is, a slot or a slit) of a common potential plate, is present, without substantially changing a related art design process and without considerably increasing a design cost. The above-mentioned official gazette discloses a method of simply checking the dimensions of the opening portion in a case where a signal line transversing the opening portion.

Concretely, according to the method described in the official gazette, a dimension (indicated by "Slot") of an opening portion 101$b$ of a power supply plate 100$b$ illustrated in FIG. 12B, and a distance (designated by "Slit") between an opening portion 101$a$ of a power supply plate 100$a$ and the center of the signal line illustrated in FIG. 12A are calculated by using predetermined computational expressions. Thus, it is verified whether or not an opening portion is provided in the target power supply plate. When the opening portion 101$b$ is provided therein, the dimension of the opening portion 101$b$ is outputted and displayed. Moreover, it is verified whether or not a signal line is present in the vicinity of the target opening portion 101$a$ of the power supply plate. When a signal line is present, it is judged whether or not the distance between the opening portion 101$a$ and the signal line is appropriate. According to a result of the judgment, an instruction for countermeasures is displayed. This official gazette describes that consequently, a design engineer can easily check what dimensions of the target opening portion 101$b$ of the power supply plate, is appropriate, and what distance between the opening portion 101$a$ and the signal line is appropriate, without substantially changing a related art design process and without needing additional design cost.

However, the technique described in the aforementioned official gazette has a drawback that in a case where many parts of the circuit board, which are referred to as the slots (see FIG. 12B) and the slits (see FIG. 12A), are to be adjusted, the degree of influence of each of the parts, which are to be adjusted, on occurrences of an electromagnetic wave radiation cannot be determined, and priorities for adjusting each of the parts, according to which one of the parts is determined so that the adjustment is started therefrom, cannot easily be known. Thus, there is possibility that the parts each generating a large amount of electromagnetic wave radiation cannot be completely adjusted within a circuit board designing period when using a verifying method and a verifying system described in the aforementioned official gazette. In this case, electromagnetic wave radiation from the entire printed circuit board cannot be effectively suppressed.

In a case where one of a plurality of power layers completely separated from each other in the same plane is set to be a target plate to be verified, the technique described in the aforementioned official gazette has another drawback in that wirings (signal lines) transversing above both the separated plates cannot be recognized by the verifying system as a part to be adjusted. This is because the verifying method and system described in the aforementioned official gazette limit the opening portions to the slot (shown in FIG. 12B) and the slit (shown in FIG. 12A) and do not have a function of detecting a gap in a case where the power supply plates are completely separated from one another. Therefore, in the case of using the verifying method and system described in the aforementioned official gazette, gap parts each having a large amount of electromagnetic wave radiation may be overlooked. Consequently, the verifying method and system described in the aforementioned official gazette have a disadvantage that an amount of electromagnetic wave radiation generated from the entire printed circuit board cannot effectively be suppressed.

It is known that a cable connected to a connector serves as an antenna and radiates electromagnetic waves in a case of a circuit board on which the connector to which the cable is to be connected is employed as a component to be mounted.

However, the method and system described in the aforementioned official gazette have still another drawback in that in a case of providing a plurality of connectors on the circuit board, the system cannot obtain information indicating which of the connectors should be selected as the one corresponding to a part to which countermeasures for suppressing electromagnetic wave radiation are applied, and that thus, a complete verification of the circuit board design cannot be performed.

SUMMARY OF THE INVENTION

The invention is accomplished to provide a method and apparatus for verifying a circuit board design, which are enabled to reliably and easily make decisions an amount of electromagnetic wave radiation and on priorities respectively assigned to parts, to which countermeasures are applied, and to provide a method and apparatus for verifying a circuit board design, which are enabled to easily make decisions on parts, on which connectors are to be mounted, and to which countermeasures for suppressing electromagnetic wave radiation should be applied.

To realize the method enabled to easily and reliably make decisions on the amount of electromagnetic wave radiation and the priorities, according to an aspect of the invention, there is provided a method for verifying a design of a circuit board having a wiring layer connecting components to be mounted, a power layer, and an insulating layer formed between the wiring layer and the power layer. The method comprises a step of detecting in an opposing region in which the wiring layer and the power layer are opposed to each other, a chipping of the power layer, which corresponds to one wiring layer and interrupts the opposing region, a step of computing a common-mode voltage to be expected to be caused at the chipping, and a step of outputting a position of the chipping and a value of the common-mode voltage caused owing to the chipping.

To realize the apparatus enabled to easily and reliably make decisions on the amount of electromagnetic wave radiation and the priorities, according to another aspect of the invention, there is provided an apparatus for verifying a design of a circuit board having a wiring layer connecting components to be mounted, a power layer, and an insulating layer formed between the wiring layer and the power layer. The apparatus comprises a detecting portion for detecting in an opposing region in which the wiring layer and the power layer are opposed to each other, a chipping of the power layer, which corresponds to one wiring layer and interrupts the opposing region, a computing portion for computing a common-mode voltage to be expected to be caused at the chipping, and an output portion for outputting a position of the chipping and a value of the common-mode voltage caused owing to the chipping.

According to this apparatus, the detecting portion detects a chipping, whose end portion is close to at least one of sides of the signal line, and a chipping in a separating portion between different power layers. The computing portion calculates a common-mode voltage caused at the detected chipping. The output portion outputs the position of the chipping, whose associated common-mode voltage is computed, and the value of the common-mode voltage associated with the chipping.

To realize the method enabled to easily make decisions on parts, on which connectors are to be mounted, and to which countermeasures for suppressing electromagnetic wave radiation should be applied, according to another aspect of the invention, there is provided a method for verifying a design of a circuit board having a wiring layer connecting components to be mounted, a power layer, an insulating layer formed between the wiring layer and the power layer, and mounting prearranged parts, on which cable-connection connectors are mounted. The method comprises a step of detecting in an opposing region in which the wiring layer and the power layer are opposed to each other, a chipping of the power layer, which corresponds to one wiring layer and interrupts the opposing region, a step of computing, in a case that the chipping is detected, a propagation value of a common-mode voltage expected at the connector when the common-mode voltage generated at the chipping propagates and reaches the connector, and a step of outputting, according to the computed propagation value, information representing whether or not a countermeasure for suppressing radiation of electromagnetic waves is required for the connector or for a cable connected to the connector.

To realize the apparatus enabled to easily make decisions on parts, on which connectors are to be mounted, and to which countermeasures for suppressing electromagnetic wave radiation should be applied, according to another aspect of the invention, there is provided an apparatus for verifying a design of a circuit board having a wiring layer connecting components to be mounted, a power layer, an insulating layer formed between the wiring layer and the power layer, and mounting prearranged parts, on which cable-connection connectors are mounted. The apparatus comprises a detecting portion for detecting in an opposing region in which the wiring layer and the power layer are opposed to each other, a chipping of the power layer, which corresponds to one wiring layer and interrupts the opposing region, a computing portion for computing, in a case where the chipping is detected, a propagation value of a common-mode voltage expected at the connector when the common-mode voltage generated at the chipping propagates and reaches the connector, and an output portion for outputting, according to the computed propagation value, information representing whether or not a countermeasure for suppressing radiation of electromagnetic waves is applied to the connector or a cable connected to the connector.

According to this apparatus, the detecting portion detects a chipping, whose end portion is close to at least one of sides of the signal line, and a chipping in a separating portion between different power layers. In a case where the chipping is detected, the computing portion computes a propagation value of a common-mode voltage expected at a connector when the common-mode voltage generated at the chipping propagates and reaches the connector. The output portion outputs, according to the computed propagation value, information representing whether or not a countermeasure for suppressing radiation of electromagnetic waves is required for the connector or for a cable connected to the connector.

In accordance with the method for verifying a circuit board design according to the present invention, in a case where there are plural chippings in a power layer, a common-mode voltage is computed correspondingly to each of the chippings. A common-mode voltage value is indicated together with a position of the associated chipping. Thus, the priorities of the chippings, for which the countermeasure for suppressing radiation of electromagnetic waves is required, can easily be decided.

The apparatus for verifying a circuit board design according to the present invention is realized by adding a constituent element having the function of measuring a common-mode voltage to constituent elements, such as a detecting portion, a computing portion and an output portion, which a circuit-board design verifying apparatus usually have. Therefore, in the apparatus having a constituent element implemented by a microcomputer, the realization of such a function can be achieved by changing a control program. When seeing indications outputted from the output portion, an operator can easily decide the priorities of the chippings for which the countermeasure for suppressing radiation of electromagnetic waves is required.

In accordance with another method for verifying a circuit board design according to the present invention, priorities for applying a countermeasure to chippings can easily be set, similarly as the case of performing the aforementioned method for verifying a circuit board design. Moreover, the propagation value of a common-mode voltage reaching the connector, which serves as an antenna for electromagnetic wave radiation by being connected to a cable, can be obtained by computing. Thus, in a case where there are plural connectors, the priorities of the connectors or the cables, for which the countermeasure for suppressing radiation of electromagnetic waves is required, can easily be decided.

Another apparatus for verifying a circuit board design according to the present invention is realized by adding a constituent element having the functions of measuring a common-mode voltage and computing the propagation value thereof to constituent elements, such as a detecting portion, a computing portion and an output portion, which a circuit-board design verifying apparatus usually have. Therefore, in the apparatus having a constituent element implemented by a microcomputer, the realization of these functions can be achieved by changing a control program. When seeing indications outputted from the output portion, an operator can easily decide the priorities of the connectors or the cables, for which the countermeasure for suppressing radiation of electromagnetic waves is required, similarly as the case of performing the method for verifying a circuit board design, which has been described immediately above.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which:

FIGS. 2A to 2C are plan views each illustrating a fundamental configuration of a circuit board; and FIG. 2D is a sectional construction view in common to all the circuit boards shown in FIGS. 2A to 2C;

DETAILED DESCRIPTION OF PREFERRED EMBODIMENTS

Hereinafter, preferred embodiments of a method and an apparatus for verifying a circuit board design according to the invention will be described in detail with reference to the accompanying drawings.

Figure 1:
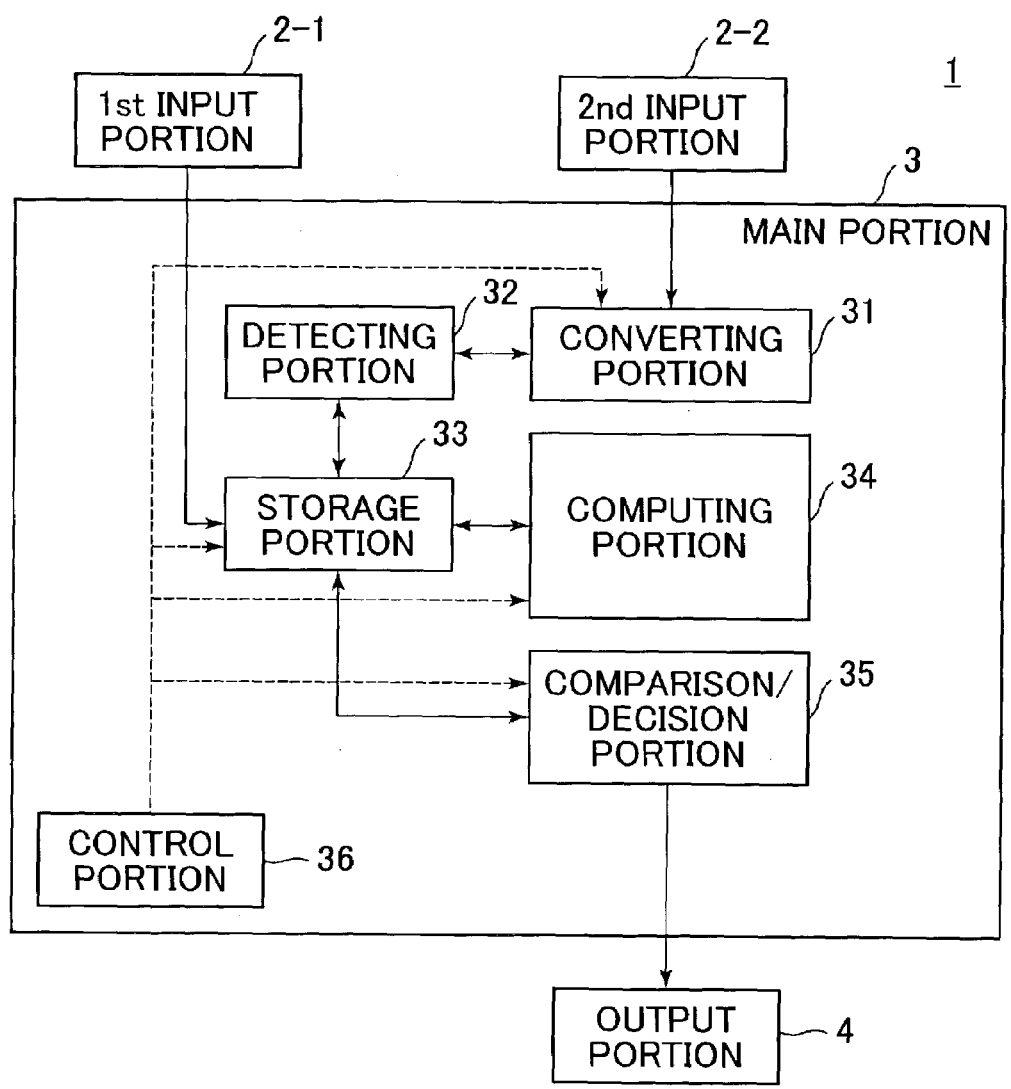
FIG. 1 is a schematic block view illustrating the configuration of an apparatus for verifying a circuit board design according to an embodiment of the invention.

FIG. 1 is a schematic block view illustrating the configuration of a verifying apparatus for verifying a circuit board design according to an embodiment of the invention.

A verifying apparatus 1 shown in FIG. 1 has a first input portion $2_{-1}$ and a second input portion 2-2, which are used for inputting various data, and a main portion 3 centered on a computer, and also has an output portion 4.

The first input portion $2_{-1}$ is constituted by input equipment, such as a keyboard, or an input interface, and is used for inputting initial condition data online or offline. The second input portion $2_{-2}$ is an input interface for inputting board data and IBIS (I/O Buffer Information Specification) model data online or offline after a tentative design is created. Alternatively, the second input portion $2_{-2}$ is a database for preliminarily storing the board data and IBIS model data. In the following description, it is assumed that the second input portion $2_{-2}$ is a database including a board database and an IBIS database.

The output portion 4 is connected to the main portion 3 and receives data representing a result of verification outputted from the main portion 3. Then, the output portion 4 converts the received data into data of a predetermined output format, and outputs or displays resultant data. The output portion 4 comprises output equipment, such as a display, a printer, and a plotter.

The main portion 3 has a converting portion 31, a detecting portion 32, a storage portion 33, a computing portion 34, a comparison/decision portion 35, and a control portion 36. The control portion 36 controls the converting portion 31, the detecting portion 32, the storage portion 33, the computing portion 34, and the comparison/decision portion 35 in such a way as to cause each of these portions to perform predetermined processing by following predetermined procedure. In a case where the main portion 3 comprises a microcomputer, at least a part of the converting portion 31, the detecting portion 32, the storage portion 33, the computing portion 34, and the comparison/decision portion 35 are implemented as processing steps of programs to be performed in the microcomputer. The verifying method according to this embodiment can be provided by supplying a recording medium in which the processing steps of the programs written in program languages are recorded.

The converting portion 31 performs format-conversion of the board data and the IBIS model data obtained from the database of the second input portion $2_{-2}$, and outputs resultant data to the detecting portion.

The detecting portion 32 is connected to the converting portion 31 and the storage portion 33. The detecting portion 32 detects a target signal line which is to be verified in the circuit board and chippings in a power layer, which affects the target signal line, by using the data format-converted by the converting portion 31. At that time, the detecting portion 32 refers to initial setting data inputted from the first input portion $2_{-1}$ and stored in the storage portion 33. A position and dimensions of the power layer is determined by the detecting portion 32. Then, the detecting portion 32 uses coordinate data to determine the kind of the chipping, that is, determine which of the categories designated as "gap", "slot" and "slit" the chipping falls into. Also, the detecting portion 32 extracts electric data of electronic components, such as ICs, to which a specific signal line designated by instructions issued from the control portion 36, from the IBIS model data format-converted and inputted from the second input portion $2_{-2}$. Then, the detecting portion 32 causes the storage portion 33 to store the extracted data at locations therein indicated by designated addresses. The detecting portion 32 and the storage portion 33 repeat the extraction of electric data and the storing of the extracted data, which correspond to each of all signal lines to be verified, according to instructions from the control portion 36.

The computing portion 34 reads from the storage portion 33 the electric data corresponding to each of the signal lines. Then, the computing portion 34 calculates quantities of electric energy applied to the signal line during an operation, for example, an effective voltage level according to the read electric data. The effective voltage level of the signal line is a criterion for determining whether or not the detecting portion 32 checks chippings in the power layer. That is, only in a case where there is a signal line whose effective voltage level is higher than a predetermined value, the detecting portion 32 checks whether or not the opposed power layer has a chipping, and what kind of chipping this power layer has.

The computing portion 34 calculates the common-mode voltage generated in this power layer according to the kind of the chipping. Moreover, the computing portion 34 calculates a propagation value of the common-mode voltage at the connector.

The comparison/decision portion 35 makes comparison of each of the common-mode voltage calculated by the computing portion 34 and the propagation value thereof with an associated and predetermined threshold. Then, the comparison/decision portion 35 determines portions in the power layer, which need countermeasures for suppressing radiation of electromagnetic waves and the connectors corresponding to these portions according to a result of the comparison.

Hereinafter, an embodiment of the verifying method according to the invention is described in relation to an operation of the verifying apparatus according to the invention, which is illustrated in FIG. 1.

FIGS. 2A to 2D show a fundamental configuration of a circuit board.

A circuit board 10 shown in FIG. 2A has a plurality of power supply plates separated from one another. As shown in this figure, a power supply plate P0 is provided correspondingly to a part on which a driver 11 is mounted as shown in this figure. The power supply plates P1, P2, P3, and P4 are disposed in this order at one of the sides of the power supply plate P0. The power supply plates P1', P2', and P3' are disposed in this order at the other side of the power supply plate P0. A receiver 12 is mounted on a corresponding part of the power supply plate P2. An output of the driver 11 is connected to an input of the receiver 12 through a signal line 13. The signal line 13 intersects with a gap G01 between the power supply plates P0 and P1 and with a gap G12 between the power supply plates P1 and P2. Incidentally, it is assumed that all the gaps between the plates have an equal length LG. The circuit board 10 has a mounting prearranged portion, on which a connector 14 is to be mounted, at an end portion thereof at the side of the power supply plate P4 and also has another mounting prearranged portion, on which a connector 14' is to be mounted, at an end portion thereof at the side of the power supply plate P3'.

A circuit board 20 shown in FIG. 2B has a power supply plate P5. A driver 21 and a receiver 22 are mounted on portions respectively corresponding to the same power supply plate P5. An output of the driver 21 is connected to an input of the receiver 22 through a signal line 23. A slit SI is formed in the power supply plate P5. The signal line 23 intersects with the slit SI. Incidentally, the distance between an end of the slit SI and the center in the direction of width of the signal line 23 is a slit width Wsi [mm].

A circuit board 40 shown in FIG. 2C has a power supply plate P6. A driver 41 and a receiver 42 are mounted on portions corresponding to the same power supply plate P6. An output of the driver 41 is connected to an input of the receiver 42 through a signal line 43. A slot SO is formed in the power supply plate P6. The signal line 43 intersects with the slot SO. Incidentally, the distance between both ends in a direction, which is perpendicular to a wiring direction of the signal line 43, of the slot SO is a slot width Wso [mm].

FIG. 2D shows a sectional structure that are common to all the circuit boards shown in FIGS. 2A to 2C.

The signal line 13 (or 23, 43) is formed on an insulating layer 50, which has a thickness h and an effective relative dielectric constant $\epsilon r_{eff}$. The power supply plate P having a chipping is formed under the insulating layer 50. In FIG. 2A, the power supply plate P corresponds to the power supply plates P0 to P2 that have the gaps G01 and G12 therebetween. In FIG. 2B, the power supply plate P corresponds to the power supply plate P5 having the slit SI. In FIG. 2C, the power supply plate P corresponds to the power supply plate P6 having the slot SO. The structure further has a power supply plate Pr having no chippings. An insulating layer 51 is formed on the power supply plate Pr. The power supply plate P having the chipping is formed on the insulating layer 51.

In each of FIGS. 2A to 2C, one of signal lines provided between the driver and the receiver is shown. In most of practical circuits, plural wirings are present between the driver and the receiver. Incidentally, all wiring elements of wiring between the driver and the receiver are referred to as all segments that is denoted by [Segments]. An arbitrary wiring element of all segments [Segments] is referred to as a segment A that is denoted by [Segment A]. Therefore, a set of all [Segment A]s existing between the driver and the receiver is equivalent to all segments [Segments].

FIGS. 3 to 7 are flowcharts illustrating the procedure of a method for verifying a circuit board design according to this embodiment.

In the case of the verifying method according to this embodiment, it is inefficient to check the common-mode voltage in the power supply plates respectively corresponding to all the signal lines. Thus, mainly in steps shown in FIG. 3, a combination of a driver and a receiver, for which electromagnetic wave radiation is problematic, is determined.

When a circuit board is designed for digital equipment, the quantity of electric energy of a pulse signal is calculated according to an amplitude (that is, a voltage value), a pulse length and a transition duration of a pulse wave of a pulse signal. The quantity of electric energy of a pulse signal is proportional to a parameter, such as an amount of electric energy at application of the pulse signal, an effective voltage level per unit of time, or electric field intensity produced at the application of the pulse signal. In this case, an effective voltage level to be applied to a signal line per unit of time is estimated.

In this embodiment, the energy level $Level_{fx}$ [dBμV] of a signal line at a maximum applicable frequency fx is obtained as a parameter proportional to the quantity of electric energy.

Figure 8:
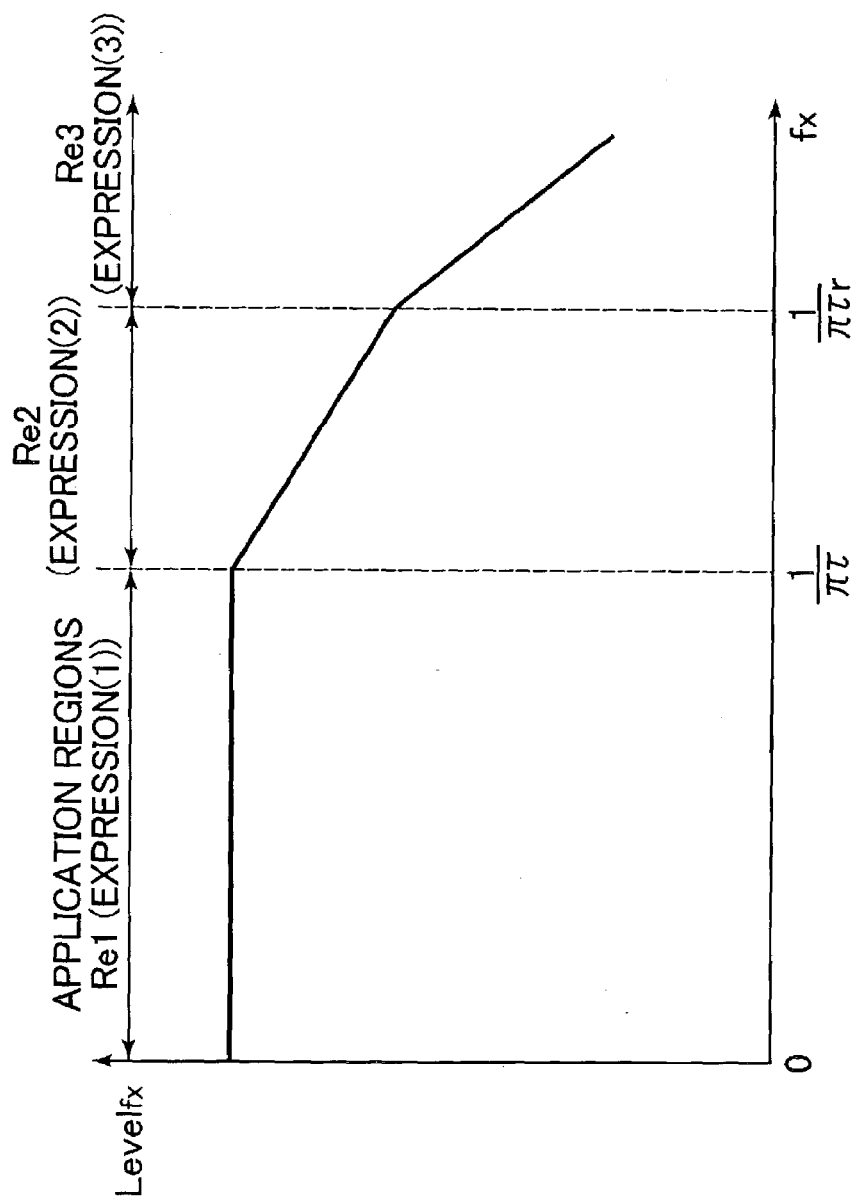
FIG. 8 is a graph illustrating the relationship between the maximum applicable frequency fx and the choice of expression used to determine the voltage level $Level_{fx}$.

As an operating frequency is increased, the energy level decreases nearly along three approximate lines shown in FIG. 8 where $\tau$ is a pulse length of a pulse signal inputted to a transmission line, and $\tau r$ is a rise time of a pulse. That is, in a region in which the frequency is equal to or less than $(1/\pi \cdot \tau)$, the voltage level $Level_{fx}$ has an almost constant value. However, when the frequency becomes higher than $(1/\pi \cdot \tau)$, the voltage level $Level_{fx}$ starts decreasing. In a case where the frequency is further increased, the rate of reducing the voltage level $Level_{fx}$ is increased still more when the frequency becomes $(1/\pi \cdot \tau r)$.

Therefore, in a region (that is, a first application region Re1) in which the frequency is equal to or less than $(1/\pi \cdot \tau)$, an approximate expression representing the signal voltage level $Level_{fx}$ is given by the following expression (1-1). In a region (that is, a second application region Re2) in which the frequency is in a range between $(1/\pi \cdot \tau)$ and $(1/\pi \cdot \tau r)$, an approximate expression representing the signal voltage level $Level_{fx}$ is given by the following expression (1-2). In a region (that is, a third application region Re3) in which the frequency is equal to or higher than $(1/\pi \cdot \tau r)$, an approximate expression representing the signal voltage level $Level_{fx}$ is given by the following expression (1-3).

$$Level_{fx} = 120 + 20\log_{10} A \tag{1-1}$$

$$Level_{fx} = 120 + 20\log_{10}(A/(fx \cdot \pi \cdot \tau)) \tag{1-2}$$

$$Level_{fx} = 120 + 20 log_{10}(A \cdot \tau r/\tau) - 40\log_{10}(fx \cdot \pi \cdot \tau r) \tag{1-3}$$

Figure 9:
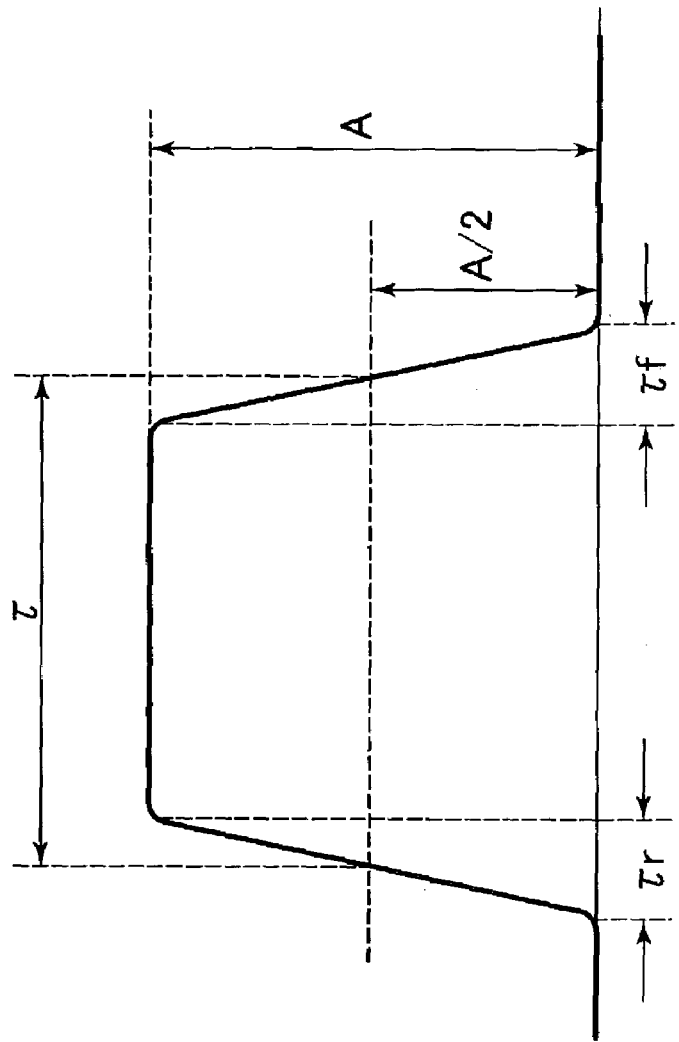
FIG. 9 illustrates the parameters of a pulse signal used in the apparatus.

Incidentally, "A" designates an amplitude of a pulse signal inputted to the transmission line. Additionally, all the parameters related to the pulse signal are illustrated in FIG. 9. The transition duration of a pulse is a shorter one of the rise time $\tau r$ and a falling time $\tau f$. In this case, the rise time $\tau r$ is employed as the transition duration.

Figure 3:
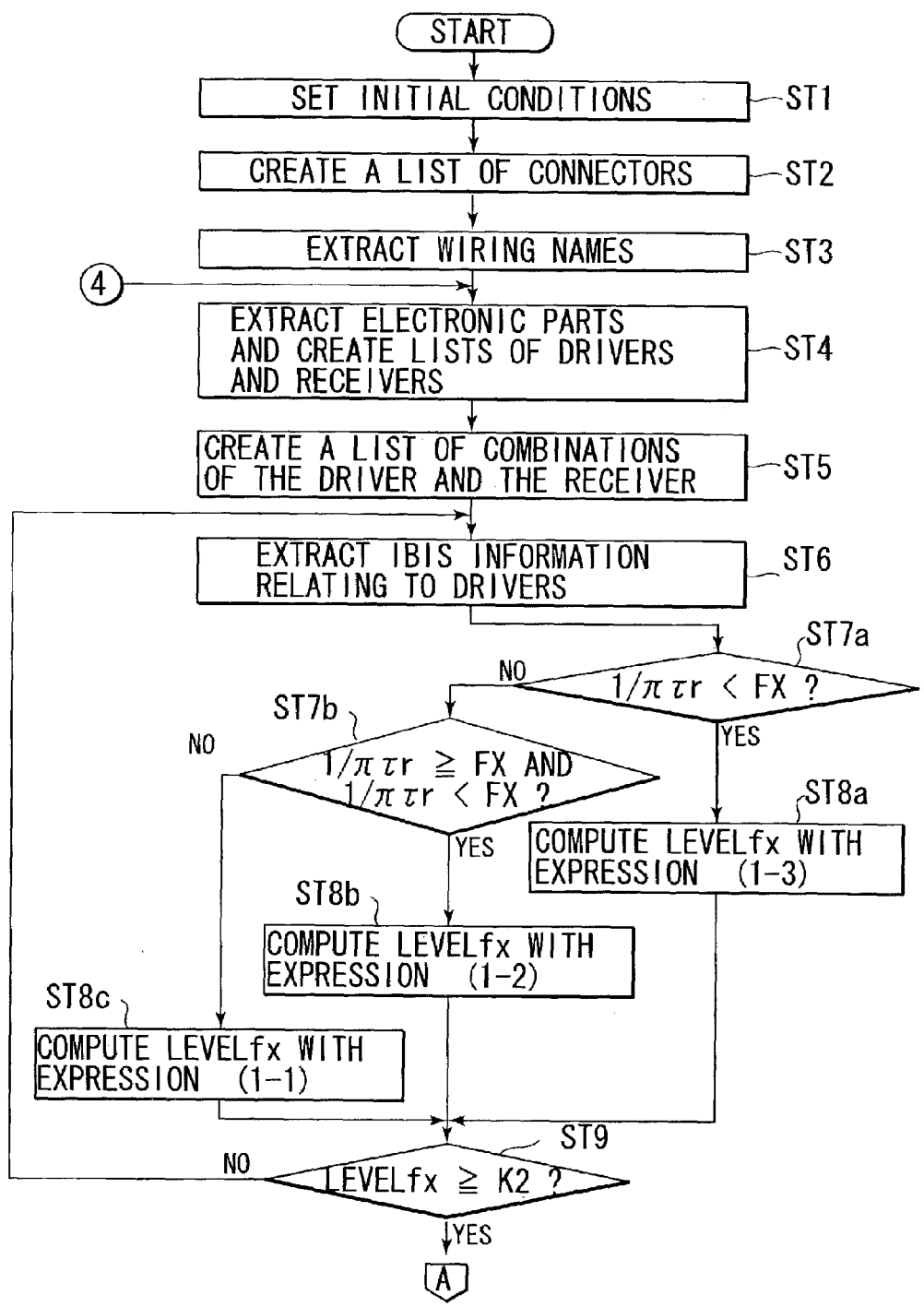
FIG. 3 is a flowchart partly illustrating a procedure for verifying a circuit board design according to the embodiment of the invention, which shows a process from Start to step ST9.

Concretely, first, in step ST1 shown in FIG. 3, initial conditions needed for verification are set. Constants K1 to K6 are set as the initial conditions. The maximum applicable frequency fx is given as the constant K1. The other constants K2 to K6 will be described later. The constants K1 to K6 are inputted from the first input portion $2_{-1}$ shown in FIG. 1 and stored in the storage portion 33.

In step ST2, a list of connectors, to each of which a cable is connected, is created by selecting connectors to be mounted on the prearranged portions of the circuit board In step ST3, all wiring names are extracted from the board database.

Concretely, the format conversion of data stored in the board database, which is registered in the second input portion $2_{-2}$, is performed by the converting portion 31. The detecting portion 32 and the control portion 36 creates the connector list and extracts the wiring names according to the data stored in the board database after the format conversion thereof is performed. The created connector list and the list of the extracted wiring names are written to locations respectively corresponding to predetermined addresses in the storage portion 33.

In step ST4, the control portion 36 selects one of the wirings (or signal line) from the list of the extracted wiring names. The detecting portion 32 and the control portion 36 extracts electronic components connected to the selected signal line from the board database after format-converted. Subsequently, the control portion 36 classifies the extracted electronic components into the categories, such as drivers, receivers, and the others and creates lists of the drivers and the receivers.

In step ST5, the control portion 36 creates a list of combinations of the driver and the receiver from the list of the drivers and the list of the receivers. The created list of the combinations is written to locations respectively corresponding to predetermined addresses in the storage portion 33.

In step ST6, the control portion 36 selects one of the combinations of the driver and the receiver from the list of the combinations of the driver and the receiver, which is stored in the storage portion 33. The selection may be randomly performed. Alternatively, the selection may be performed according to a certain criterion, for example, may be selected sequentially in a descending order of the operating frequency. In step ST6 or preliminarily, preceding to step ST6, the format conversion of IBIS information registered in the second input portion $2_{-2}$ is performed in the converting portion 31.

The detecting portion 32 extracts information on parameters related to signals outputted from the driver of the selected combination, that is, information on electric properties, such as the amplitude A, the pulse length $\tau$, and the rise time of a pulse $\tau r$, from the format-converted IBIS information.

The control portion 36 determines according to the extracted parameters which of the linear approximation regions Re1, Re2, and Re3 shown in FIG. 8 should be employed.

Concretely, in step ST7a, the control portion 36 judges which of $(1/\pi \cdot \tau r)$ and the maximum applicable frequency fx is larger than the other. In a case where $(1/\pi \cdot \tau r)$ is less than the maximum applicable frequency fx, the high-speed linear approximation region Re3, in which the voltage level is determined depending upon all the parameters A, T, and Tr, is employed. The process goes to step ST7b of the processing flow. On the other hand in a case where $(1/\pi \cdot \tau r)$ is equal to or more than the maximum applicable frequency fx, it is further judged in step ST7b which of $(1/\pi \cdot \tau)$ and the maximum applicable frequency fx is larger than the other. In a case where it is decided in step ST7b that $(1/\pi \cdot \tau)$ is less than the maximum applicable frequency fx, the medium-speed linear approximation region Re2, in which the voltage level is determined depending upon the parameters A and $\tau$, is employed, and the process goes to step ST8b of the processing flow. Conversely, in a case where it is decided in step ST7b that $(1/\pi \cdot \tau)$ is equal to or more than the maximum applicable frequency fx, the low-speed linear approximation region Re1, in which the voltage level is determined depending only upon the parameter A, is employed, and the process goes to step ST8c of the processing flow.

In step ST8a, the voltage level $Level_{fx}$ of the signal is computed by using the expression (1-3). In step ST8b, the voltage level $Level_{fx}$ of the signal is computed by using the expression (1-2). In step ST8c, the voltage level $Level_{fx}$ of the signal is computed by using the expression (1-1). The computing portion 34 sequentially performs these operations according to the computational expressions (or computational procedure) held in the control portion 36 or the storage portion 33.

Figure 4:
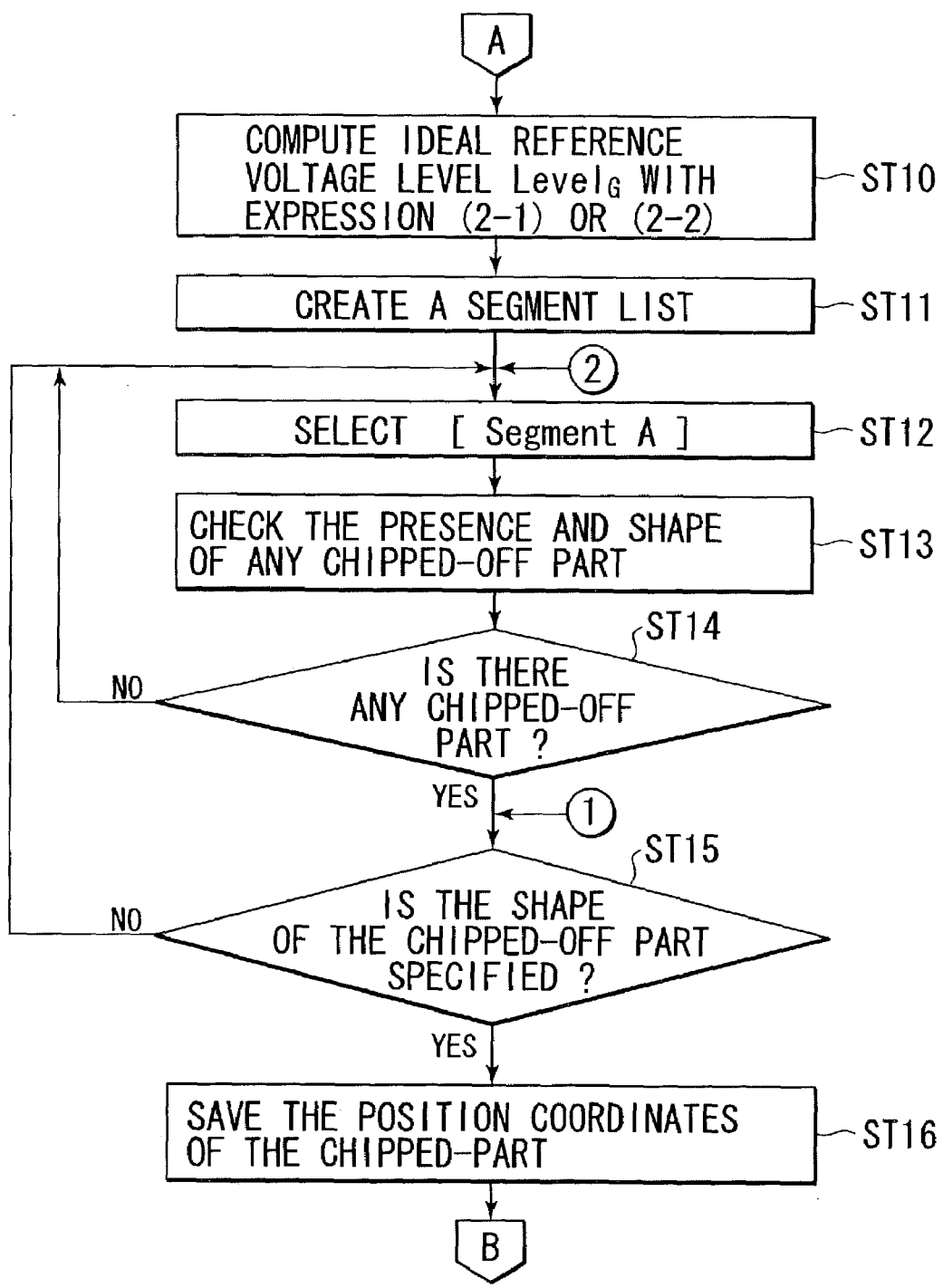
FIG. 4 is a flowchart partly illustrating the procedure for verifying a circuit board design, which shows a process subsequent to the process illustrated in FIG. 3 and including step ST10 to step ST16.

In step ST9, the comparison/decision portion 35 decides which of a result of the operation and a reference voltage level K2 is larger than the other In a case where the voltage level $Level_{fx}$ is equal to or more than the reference voltage level K2, the electric energy of the signal line is large, so that the process goes to step ST10 of the processing flow shown in FIG. 4. This is because the electric energy of the signal line is high, so that the calculation of a common-mode voltage is needed. In a case where the voltage level $Level_{fx}$ is less than the reference voltage level K2, it is judged that, since the electric energy of the signal line is relatively low, the checking of the common-mode voltage is unnecessary.

The process goes back to step ST6 of the processing flow. Then, in step ST6, the set including another driver is selected. The IBIS information on the selected driver is extracted. Thereafter, the process including steps ST7a to ST9 is performed.

In step ST10, it is assumed that "the signal line is an ideal microstrip wiring having no chippings". When a pulse having the maximum applicable frequency fx is applied to the signal line, the energy level $Level_G$ [dBµV] (hereunder referred to as an ideal reference voltage level) of the reference voltage plate among the power supply plates is computed. The ideal reference voltage level $Level_G$ is obtained by using one of the expressions (2-1) and (2-2) respectively corresponding to the conditions classified according to the value of the maximum applicable frequency fx.

In a case of $fx \leq 3000 \times 10^6$:

$$Level_G = Level_{fx} - 80 + 30 \times (fx/(3000 \times 10^6)) \quad (2\text{-}1)$$

In the case that $fx > 3000 \times 10^6$:

$$Level_G = Level_{fx} - 50 \quad (2\text{-}2)$$

In step ST11, the wiring structure between the driver and the receiver is checked in a direction from the driver to the receiver. The detecting portion 32 performing the check of the wiring structure by simultaneously referring to the board database after the format conversion of data stored in the storage portion 33. As a result of the check, all segments [Segments] between the driver and the receiver are extracted. The list of the segments is created by the control portion 36. The created list of the segments is stored at locations corresponding to the predetermined addresses in the storage portions.

In step ST12, the control portion 36 selects one [Segment A] of the segments stored in the storage portion 33. In step ST13, the detecting portion 32 checks the presence/absence of a chipping in the power supply plate and the shape of the chipping. In a case where there is a chipping, and that the shape of the chipping can be determined, a decision made by the comparison/decision portion 35 is "YES" in steps ST14 and ST15. In this case, in step ST16, position coordinates of this chipping are written to locations respectively corresponding to predetermined addresses of the storage portion 33. Conversely, in a case where there are no chippings, or that although there is a chipping, the shape of the chipping cannot be determined, a decision made by the comparison/decision portion 35 is "NO" at least in one of steps ST14 and ST15. Then, the process goes back to step ST12 of the processing flow, and another segment is selected. Then, processing and judgment are performed on the selected different segment in steps ST13 to ST15. In a case where there is a chipping in the selected different segment, and that the shape of the chipping is determined, the position coordinates of the chipping are stored in step ST16.

Figure 5:
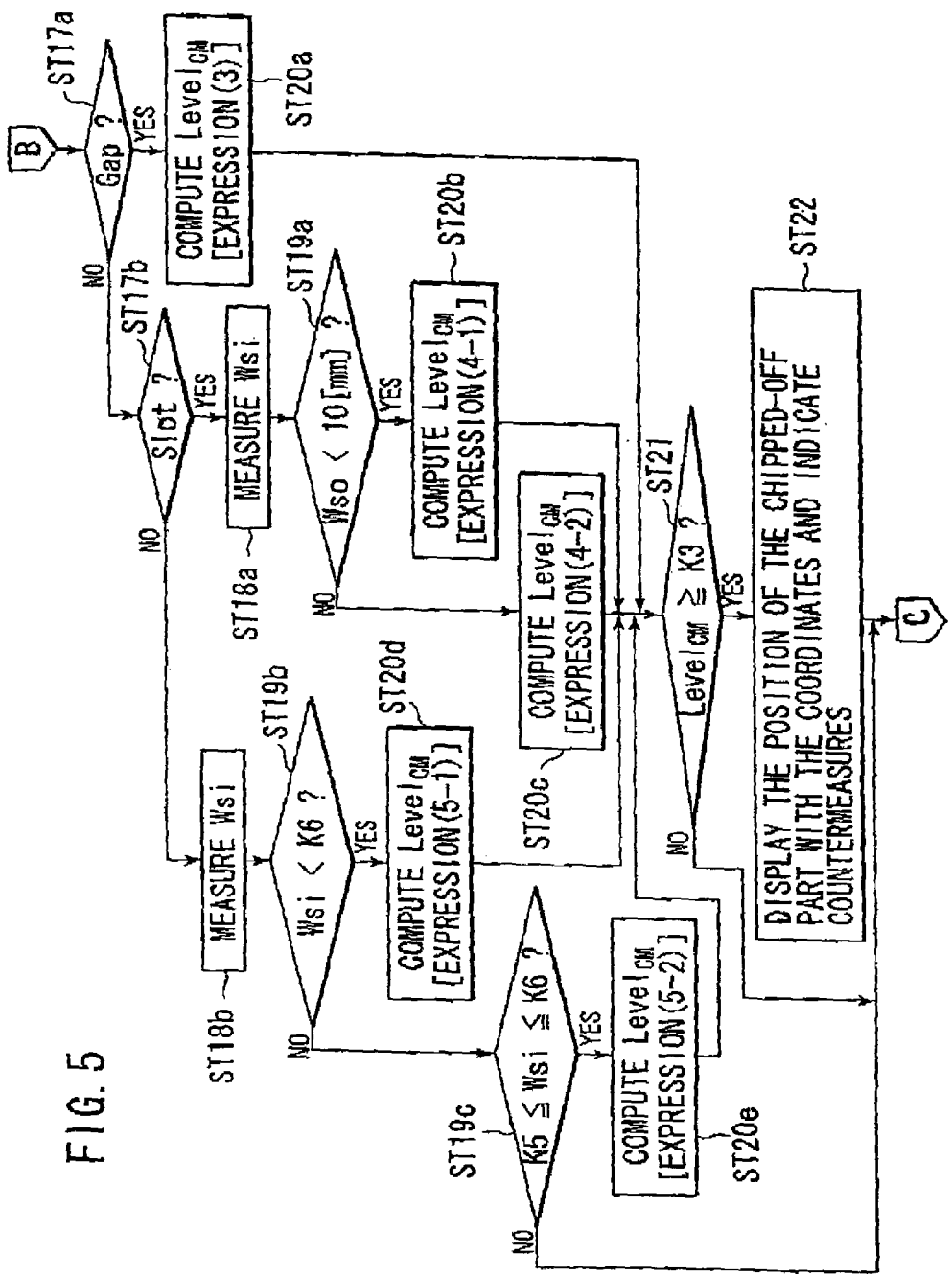
FIG. 5 is a flowchart partly illustrating the procedure for verifying a circuit board design, which shows a process subsequent to the process illustrated in FIG. 4 and including step ST17a to step ST22.

In step ST17a shown in FIG. 5, the comparison/decision portion 35 determines whether or not the chipping is a gap. In a case where the chipping is a gap, the computing portion 34 computes the energy level (hereunder referred to as a common-mode voltage) $Level_{CM}$ [dBµV] caused in the power supply plate (that is, a power supply voltage plate or a reference voltage plate) by using the following expression (3).

$$Level_{CM} = Level_G + 50 \quad (3)$$

In a case where a decision made in step ST17a is "NO", the comparison/decision portion 35 judges in step ST17b whether or not the chipping is a slot. In a case where the chipping is a slot, the detecting portion 32 measures a slot width Wso in step ST18a. When the slot width Wso is less than 10 [mm], a decision made by the comparison/decision in step ST19a is "YES", and the process goes to step ST20b of the processing flow. When the slot width Wso is equal to or more than 10 [mm], a decision made by the portion 35 in step ST19a is "NO", and the process goes to step ST20c of the processing flow. The criterion, which is 10 [mm] in this case, is a numerical value determined according to a result of simulation based on a supposed board structure. When the board structure is changed, another numerical value can be used.

The computing portion 34 computes the common-mode voltage level $Level_{CM}$ of the power supply plate, which is caused at this slot, by using the following expression (4-1) in step ST20b or the following expression (4-2) in step ST20c. Coefficients and constants in the expressions (4-1) and (4-2) can be changed according to a result of simulation based on the board structure.

$$Level_{CM} = Level_G + 6.9176 \times Ln(Wso) - 2.1188 \quad (4-1)$$

$$Level_{CM} = Level_G + 50 \quad (4-2)$$

In a case where a decision made in step ST17b is "NO", it is decided that the chipping is a slit. In step ST18b, the detecting portion 32 measures a slit width Wsi thereof. In steps ST19b and ST19c, the comparison/decision portion 35 makes comparison of the slit width Wsi with initially preset constants K5 and K6. When the slit width Wsi is larger than the constant K6, a decision made in step ST19b is "YES", and the process goes to step ST20d. When the slit width Wsi is equal to or less than the constant K6, and is equal to or more than the constant K5, a decision made in step ST19c is "YES", and the process goes to step ST20e.

The computing portion 34 computes the common-mode voltage level $Level_{CM}$ of the power supply plate, which is caused at this slit, by using the following expression (5-1) in step ST20d or the following expression (5-2) in step ST20e. Coefficients and constants in the expressions (5-1) and (5-2) can be changed according to a result of simulation based on the board structure.

$$Level_{CM} = Level_G + 50 \quad (5-1)$$

$$Level_{CM} = Level_G + 40 + 2 \times (Wsi/K5) \quad (5-2)$$

In step ST21, the comparison/decision portion 35 makes comparison of each of the common-mode voltage level $Level_{CM}$ computed in steps ST20a, ST20b, ST20c, ST20d, and ST20e with the threshold K3. When it is found as a result of the comparison that the common-mode voltage level $Level_{CM}$ is equal to or more than the threshold K3 (that is, a decision made in step ST21 is "YES"), the position coordinates of the chipping (that is, the gap, the slot, or the slit) and the countermeasure to reduce the common-mode voltage are indicated in step ST22. This indication is directed by the control portion 36 and performed by the output portion 4.

In a case where the decision made in step ST21 is "NO", the processing to be performed in step ST22 is skipped. When the decision made in step ST19c is "NO", it is judged that the slit is small and thus the countermeasure is unnecessary. Similarly, the processing to be performed in step ST22 is skipped.

Figure 6:
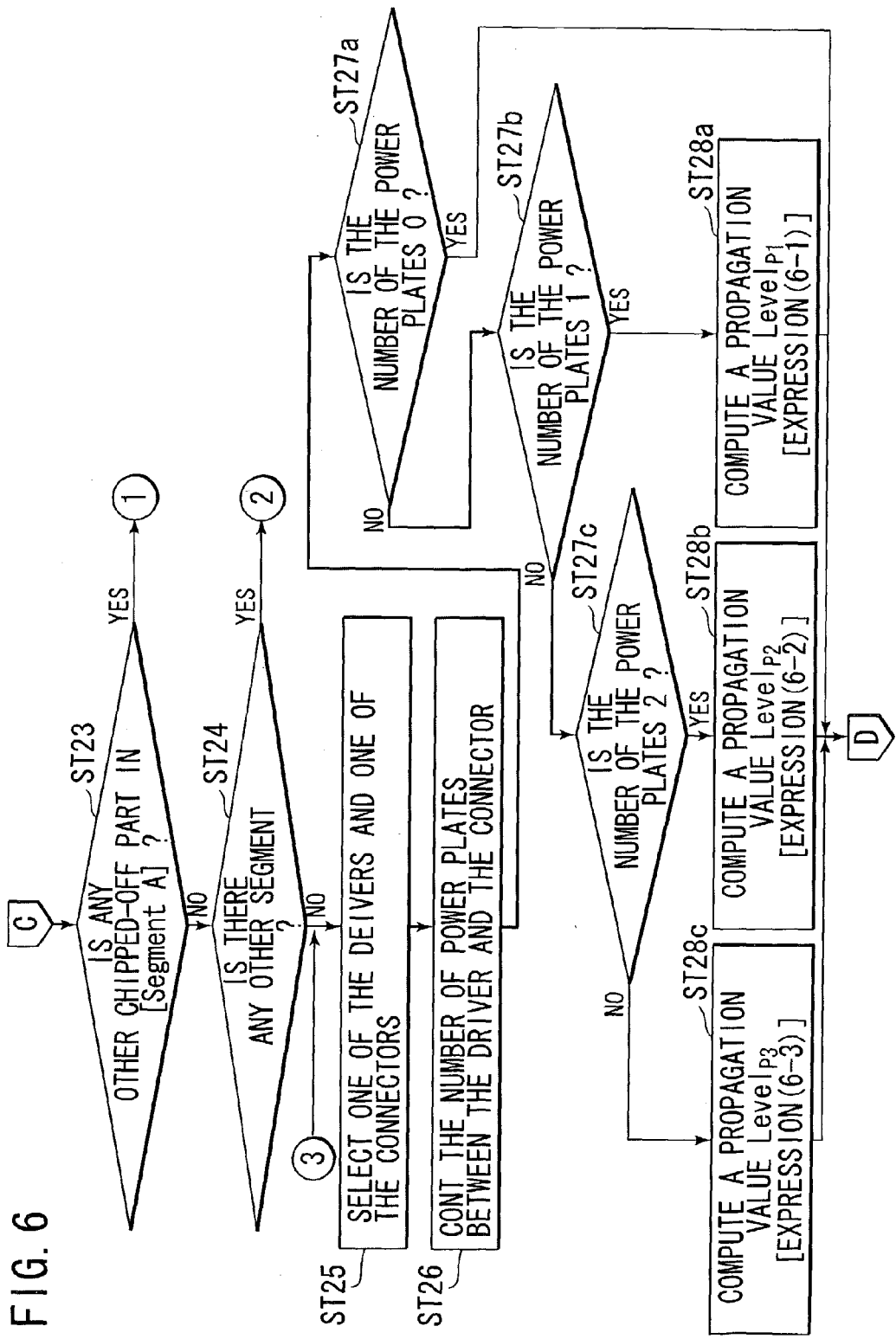
FIG. 6 is a flowchart partly illustrating the procedure for verifying a circuit board design, which shows a process subsequent to the process illustrated in FIG. 5 and including step ST23 to step ST28c.

In step ST23 shown in FIG. 6, the detecting portion 32 checks whether or not there is another chipping in [Segment A]. In a case where there is another chipping, the process goes back to step ST15 of the processing flow shown in FIG. 4. Then, the processing and judgment to be conducted in steps ST15 to ST23 are performed on this newly recognized chipping. Upon completion of performing the processing and judgment, which are to be conducted in steps ST15 to ST23, on all chippings in [Segment A], the decision made in step ST23 becomes "NO".

In step ST24, the comparison/decision portion 35 decides whether or not there is an unprocessed segment in the segment list created in step ST11. When there is an unprocessed segment, the process goes back to step ST12 of the processing flow shown in FIG. 4. Then, the processing and judgment to be conducted in steps ST12 to ST24 are performed on the newly recognized and unprocessed segment. Upon completion of performing the processing and judgment, which are to be conducted in steps ST12 to ST23, on all the segments in the segment list, the decision made in step ST24 becomes "NO".

In step ST25, the control portion 36 selects one of the drivers (of the combination of the driver and the receiver, which corresponds to the chipping that needs the countermeasure) and one of the connectors in the connector list created in step ST2.

In step ST26, the detecting portion 32 counts the number of power supply plates provided between the connector and the driver, which are selected in step ST25.

In step ST27a, the comparison/decision portion 35 decides whether or not the number of the power supply plates is 0. When a decision made in step ST27a is "YES", the connector and the driver are disposed on the same power supply plate. Then, it is judged that each of the common-mode voltages $Level_{CM}$ computed in steps ST20a to ST20e propagates to the connector without modification.

When the decision made in step ST27a is "NO", the comparison/decision portion 35 decides in step ST27b whether or not the number of the power supply plates is 1. When a decision made in step ST27b is "NO", the comparison/decision portion 35 decides in step ST27c whether or not the number of the power supply plates is 2.

When the decision made in step ST27b is "YES", in step ST28a, the computing portion 34 uses the following expression (6-1) and computes the propagation value $Level_{P1}$ [dBµV] of the common-mode voltage $Level_{CM}$ in a case where the number of the power supply plates is 1. When a decision made in step ST27c is "YES", in step ST28b, the computing portion 34 uses the following expressions (6-1) and (6-2) and computes the propagation value $Level_{P2}$ [dBµV] of the common-mode voltage $Level_{CM}$ in the case that the number of the power supply plates is 2. When the decision made in step ST27c is "NO", it is decided that three or more power supply plates are disposed between the connector and the driver. In step ST28c, the computing portion 34 uses the following expressions (6-1) to (6-3) and computes the propagation value $Level_{P3}$ [dBµV] of the common-mode voltage $Level_{CM}$ in the case that the number of the power supply plates is 3 or more.

$$Level_{P1} = Level_{CM} - 18 \quad (6-1)$$

$$Level_{P2} = Level_{P1} - 6 \quad (6-2)$$

$$Level_{P3} = Level_{P4} = \ldots = Level_{P2} - 3 \quad (6-3)$$

Figure 7:
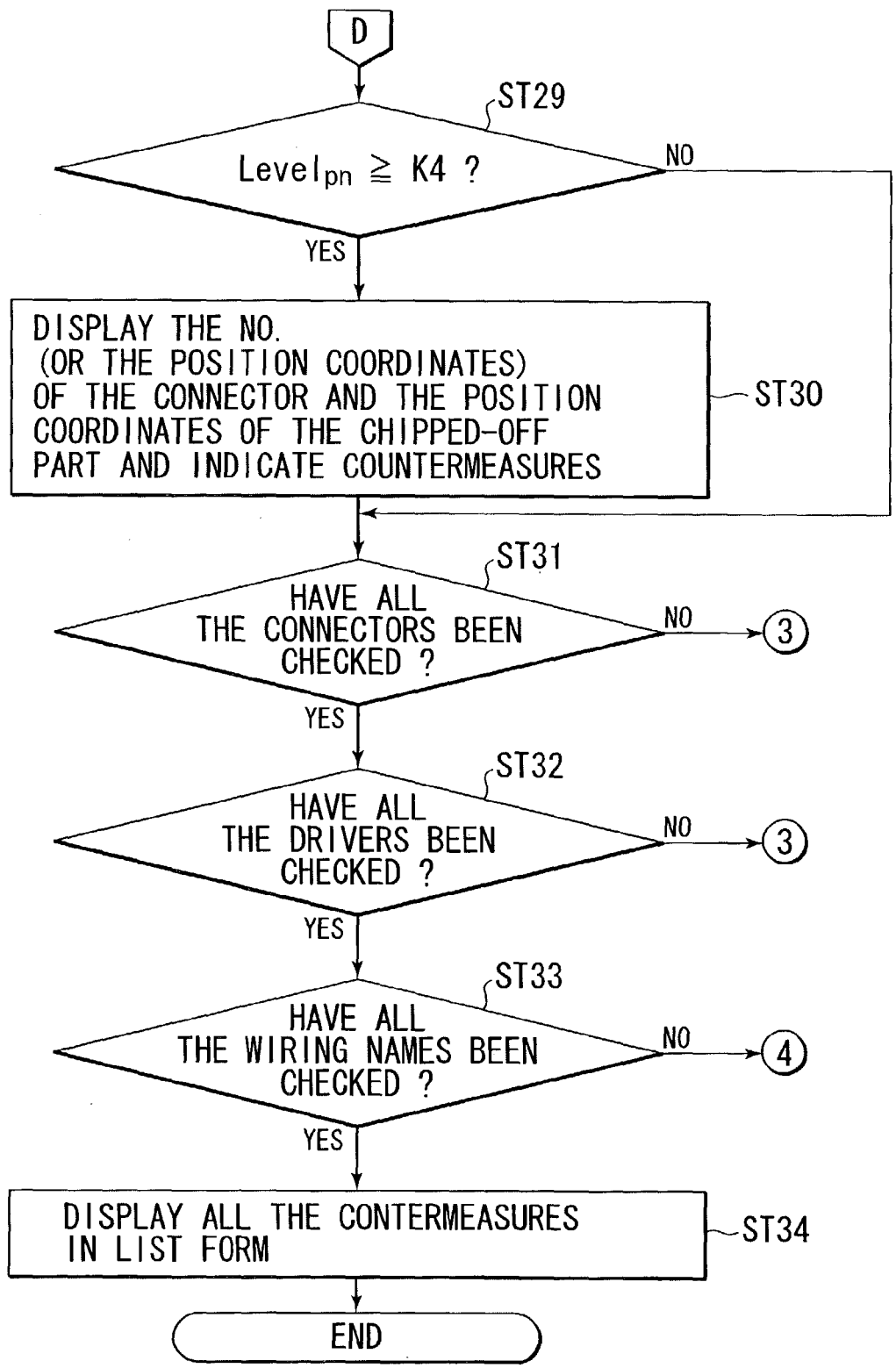
FIG. 7 is a flowchart partly illustrating the procedure for verifying a circuit board design, which shows a process subsequent to the process illustrated in FIG. 6 and including step ST29 to End.

In step ST29 shown in FIG. 7, the comparison/decision portion 35 makes comparison of the computed propagation value $Level_{Pn}$ (n: a natural number) [dBµV] with the threshold K4. When the propagation value $Level_{Pn}$ is equal to or more than the threshold K4 (that is, a decision made in step ST29 is "YES"), it is judged that there is possibility that this connector serves as an antenna, and that electromagnetic wave radiation noises are generated. Thus, in step ST30, the number (or the position coordinates thereof) of this connector and the position coordinates of the chipping are displayed. Countermeasures against the electromagnetic wave radiation are indicated. This display is directed by the control portion 36 and performed by the output portion 4.

When the decision made in step ST29 is "NO", the processing to be performed in step ST30 is skipped.

In step ST31, the control portion 36 decides whether or not another unchecked connector in connection with the driver selected in step ST25 is present. When a decision made in step ST31 is "NO", the process goes back to step ST25 of the processing flow shown in FIG. 6. Then, only another unchecked connector is selected again without changing the driver. The processing and judgment to be performed in steps ST25 to ST31 are repeated from the new selection of the connector in step ST25 until the decision made in step ST31 becomes "YES".

When the decision made in step ST31 becomes "YES", in step ST32, the control portion 36 decides whether or not another unchecked driver other than the driver selected in step ST25 in connection with the connector is present. When a decision made in step ST32 is "NO", the process goes back to step ST25 of the processing flow shown in FIG. 6. Then, an unchecked driver is selected again. The processing and judgment to be performed in steps ST25 to ST32 are repeated from the new selection of the driver in step ST25 until the decision made in step ST32 becomes "YES".

When the decision made in step ST32 becomes "YES", in step ST33, the control portion 36 decides whether or not an unchecked wiring is present among those having the wiring names extracted in step ST3 shown in FIG. 3. When a decision made in step ST33 is "NO", the process goes back to step ST4 of the processing flow shown in FIG. 3. Then, the processing and judgment to be performed in steps ST4 to ST33 are repeated until the decision made in step ST33 becomes "YES".

When the decision made in step ST33 becomes "YES", in step ST34, the countermeasures against the chippings and the connectors are displayed in a list. Thus, the verification of the circuit board design is completed. Incidentally, the countermeasures against the connector includes those performed on the cable connected to the connector, in addition to those against the electromagnetic wave radiation to be performed on the connector itself.

Hereinafter, an example of identifying a portion, at which it was highly likely that electromagnetic wave radiation occurs, in a circuit board and indicating countermeasures against this by using the verifying method according to this embodiment of the invention is described with reference to the accompanying drawings.

Figure 10:
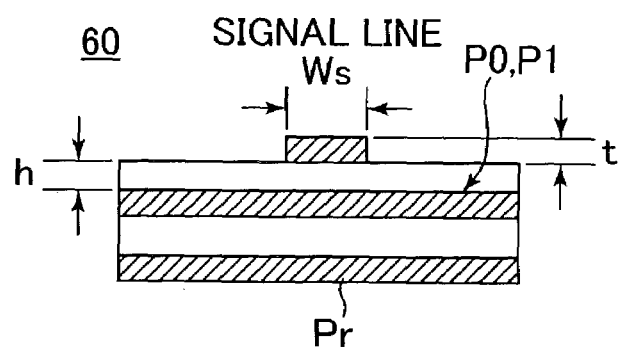
FIG. 10A is a sectional view illustrating a wiring structure according to an embodiment of the invention.
FIG. 10B is a plan view schematically illustrating the configuration of a circuit board verified according to this embodiment.
Figure 10:
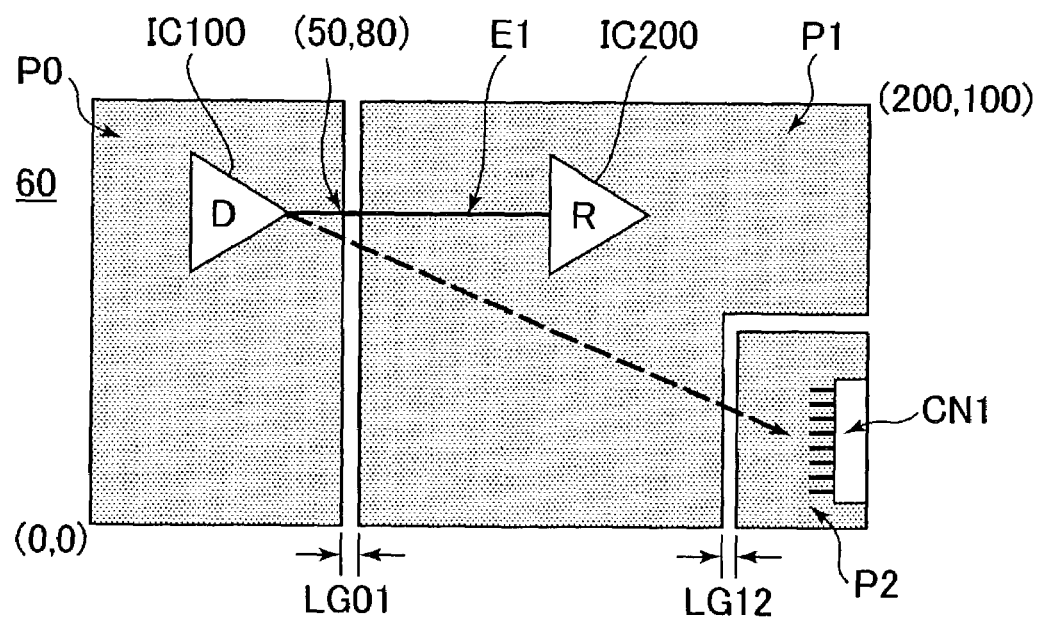

FIG. 10A is a cross-sectional view illustrating a wiring structure according to this embodiment. FIG. 10B is a plan view schematically illustrating the configuration of the circuit board verified according to this embodiment.

An illustrated circuit board 60 had three power supply plates P0, P1, and P2 separated from one another. The power supply plate P0 was disposed at a place corresponding to a portion on which a driver IC 100 (designated by reference character "D") was mounted. The power supply plate P1 was disposed at a place corresponding to a portion on which a receiver IC 200 (denoted by reference character "R") was mounted. The power supply plate P2 was disposed at a place corresponding to a portion on which a connector NC1 was mounted. Gaps respectively having gap lengths LG01 and LG12 were formed between the power supply plates P0 and P1 and between the power supply plates P1 and P2, respectively. The driver IC 100 was connected to the receiver IC200 by a wiring E1.

The wiring E1 had a microstrip-line structure and was formed from an electrically conductive layer that had a thickness t of 0.03 [mm] and a width Ws of 0.1 [mm]. The wiring E1 was formed on an insulating layer 50 that had a thickness h of 0.1 [mm] and an effective relative dielectric constant $\epsilon r_{eff}$ of 3.0. The power supply plates P0 and P1, between which the gap was provided, were formed under the insulating layer 50. A supply voltage VDD0 was applied to the power supply plate P0. A supply voltage VDD1 was applied to the power supply plate P1. At a portion including a lower area not shown in FIG. 10A, the power supply plate P2, to which a supply voltage VDD2 was applied, was formed in the same hierarchy as that of the other power supply plates P0 and P1. The length LG01 of the gap between the power supply plates P0 and P1 and that of the gap between the power supply plates P1 and P2 were 0.3 [mm]. An insulating layer 51 was formed under the power supply plates P0 to P2. A power supply plate Pr, which had no chippings and was held at ground potential GND, was formed under the insulating layer 51.

The operating frequency of the driver IC100 was 50 [MHz]. The width of an output pulse thereof was 10 [ns]. The rise time τr of an output pulse therefrom was 1 [ns]. The amplitude voltage A of the output pulse thereof was 3.3 [V].

The circuit board described immediately above was verified according to the flowcharts of FIGS. 3 to 7. Incidentally, the flow of verification of this example is indicated by solid arrows.

In step ST1, the constant K1 for the maximum applicable frequency fx, the thresholds K2, K3, K4, and the constants K5 and K6 were respectively set to be 1000 [MHz], 80 [dBμV], 70 [dBμV], 60 [dBμV], 0,1 [mm], and 0.5 [mm] as initial conditions.

In step ST2, data CN1 was extracted as that indicating connector numbers, to each of which a cable was to be connected. Then, a connector list (CN1) was created.

In step ST3, wiring names {E1} were extracted.

In step ST4, the components connected to the wirings were extracted. The list of the drivers {IC100} and the list of the receivers {IC200} were created from the extracted components.

In step ST5, the list of the combinations of the driver and the receiver {IC100, IC200} was created In step ST6, the pulse width τ (=10.0 [ns]), the rise time τr of a pulse (=1.0 [ns]), and the amplitude voltage A of a pulse (=3.3 [V]) were extracted from the IBIS mode data of the drivers.

The decision made in step ST7a was "YES" because (1/π·τr) was less than the maximum applicable frequency fx (=1000 [MHz]). Therefore, in step ST8a, the computation was performed by using the expression (1-3). Thus, the energy level $Level_{fx}$ of the wiring E1 (=90.5 [dBμV]) at the maximum applicable frequency fx was calculated.

In step ST9, the energy level $Level_{fx}$ (=90.5 [dBμV]) was compared with the threshold K2 (=80 [dBμV]). Because the energy level $Level_{fx}$ was larger than the threshold K2, the decision made in step ST9 was "YES".

The maximum applicable frequency fx was lower than 3 [GHz], so that the expression (2-1) was employed in step ST10. Then, the ideal reference voltage level $Level_G$ (=20.5 [dBμV]) was obtained by performing an operation using the expression (2-1).

In step ST11, the wiring structure of the wiring E1 was checked in a direction from the driver IC100 to the receiver IC200, so that a wiring configuration list {Segment A} was created.

In step ST12, a segment [Segment A] was selected from the wiring configuration list {Segment A}.

In step ST13, it was checked whether or not a chipping was present in the power supply plate facing the wiring E1 ([Segment A]), and what kind of the shape of the chipping was when the chipping was present therein.

Because the gap was present between the power supply plates P0 and P1, both the decisions made in steps ST14 and ST15 were "YES".

In step ST16, an origin was set as shown in FIG. 10B. The coordinates of the chipping were determined to be (50, 80). The determined coordinates were saved.

Since the chipping was a gap, the decision made in step ST17a was "YES". In step ST20a, an operation using the expression (3) was performed, so that the common-mode voltage $Level_{CM}$ (=70.5 [dBμV]) was obtained.

In step ST21, the common-mode voltage $Level_{CM}$ (=70.5 [dBμV]) was compared with the threshold K3 (=70 [dBμV]). Because the energy level $Level_{CM}$ was larger than the threshold K3, the decision made in step SST21 was "YES".

In step ST22, the coordinates of the gap (50, 80) and the common-mode voltage $Level_{CM}$ (=70.5 [dBμV]) were displayed In the case of this example, the chipping was only one gap, and the wiring was only one. Therefore, both the decisions made in steps ST23 and ST24 were "NO". In step ST25, the connector [CN1] was selected from the connector list. In step ST26, the number of the power supply plates between the driver IC100 and the connector CN1 were counted. Because the number of the power supply plates was 2, the decisions made in steps ST27a and ST27b were "NO", and the decision made in step ST27c was "YES".

In step ST28b, an operation using the expression (62) was performed. The propagation value $Level_{P2}$ (=64.5 [dBμV]) of the common-mode voltage in the case, in which the number of the power supply plates was 2, was obtained.

In step ST29, the propagation value $Level_{P2}$ (=64.5 [dBμV]) of the common-mode voltage was compared with the threshold K4 (=60 [dBμV]). Because the propagation value $Level_{P2}$ (=64.5 [dBμV]) was larger than the threshold K4, the decision made in step ST29 was "YES".

In step ST30, the connector number (CN1), the coordinates of the gap (50, 80), and the countermeasures against electromagnetic wave radiation were indicated. In the case of this example, the countermeasures against the chipping to be indicated in step ST22, and the countermeasures for the connector were indicated together in this step ST30.

Practically, the indication of the countermeasures is performed by displaying, for instance, the following messages.

Countermeasure 1: "Change the shape of the plates, alternatively, change the route of the wiring (that is, the position and shape of the wiring). Decrease the gaps with which the wirings intersect".

Countermeasure 2: "Add a capacitor to a place in the vicinity of a gap, with which the wiring intersects, to bypass a return path."

Countermeasure 3: "If there is a gap in a plate of equal potential, form a return path by placing guard wirings along both sides of the wiring". (Here, the "guard wiring" is a wiring having a width twice as large as the signal line width or more.)

Countermeasure 4: "Contemplate addition of a noise countermeasure component to a connector adapted to be connected to a cable and to have a power or ground terminal to which no noise countermeasure component is inserted if a high-level common-mode noise is expected to propagate thereto."

In the case of this example, even when the circuit board has a single connector and a single driver, the number of the wiring is also 1. Thus, all the decisions made in steps ST31 to ST33 were "YES". After the countermeasures corresponding to the gap and those corresponding to the connector were displayed in list form in step ST34, an operation of verifying the circuit board design finished.

To verify the validity of the expressions, a circuit board, in which a signal line, an insulating layer, a ground potential plate were stacked, was prepared. Further, antennas were put up in a preferable manner. Then, the energy level radiated electromagnetic waves was measured.

Figure 11:
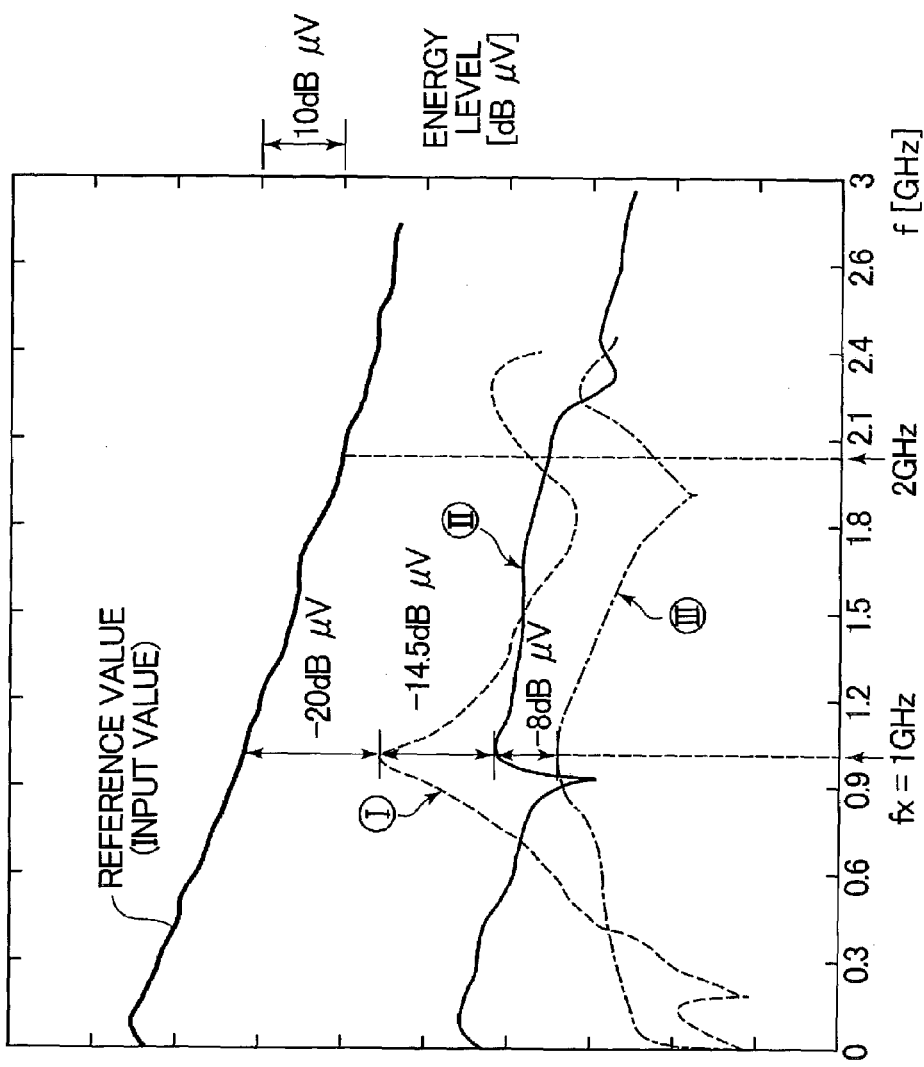
FIG. 11A is a view illustrating the relation between a signal line and each of four-divided ground potential plates.
FIG. 11B illustrates a result of a measurement of an energy level of electromagnetic waves radiated from each of three antennas by changing the frequency of a pulse inputted from an end of a signal line.
Figure 12:
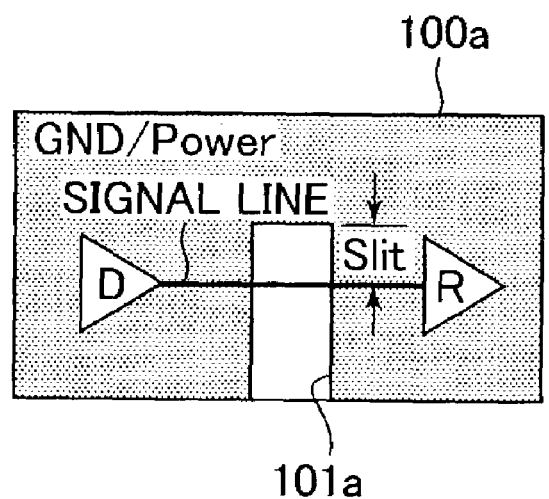
FIGS. 12A and 12B are views each illustrating a chipping in a power supply plate of a circuit board to be verified according to a related art document.
Figure 12:
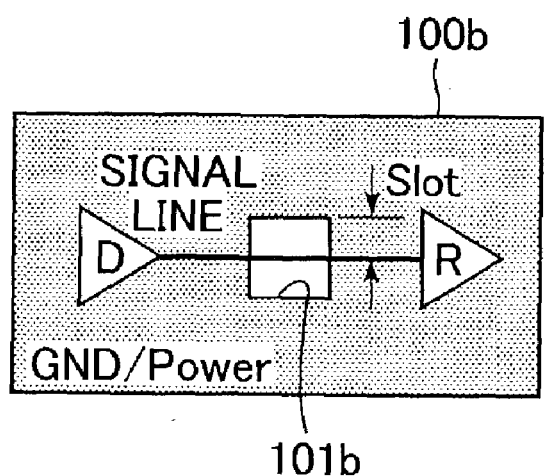

FIG. 11A illustrates the relation of the ground potential plate, which was divided into four plates P0 to P3, and the signal line. The ground potential plate having a width of 40 mm was divided into four plates P0 to P3. A gap was formed between adjacent ones of the four plates P0 to P3. A signal line was formed from upper conductive layers of the plates P0 to P3. The length of a part of the signal line extending above the plate P0 was 50 mm. The length of a part of the signal line extending above the plate P1 was 20 mm. The length of a part of the signal line extending above the plate P2 was 30 mm. The characteristic impedance was 50 Ω. A 50 Ω load resistance was inserted into a middle part of the signal line at a place located above the plate P1. The energy level was measured by putting up the antenna in the proximity of the gap, which is indicated by "I". Similarly, an antenna was put up in the proximity of each of the gaps between the plates P1 and P2 and the gap between the plates P2 and P3. Then, the energy level of radiated electromagnetic waves was measured at places indicated by "II" and "III".

The circuit board illustrated in FIG. 11A was verified according to the flowcharts of FIGS. 3 to 5. The common-mode voltage $Level_{CM}$ in the case, in which the maximum applicable frequency fx was 1 GHz, was obtained by performing calculation using the expressions (1-1) to (3). As a result, −20 [dBμV] was found from the input as the value of the common-mode voltage measured at the place "I". The propagation values of the common-mode voltage at the place "I" was obtained by calculation using the expressions (6-1) and (6-2). Thus, at the place "II", −18 [dBμV] was obtained as the propagation value $Level_{P1}$ of the common-mode voltage caused at the place "I". At the place "III", −6 [dBμV] was obtained as the propagation value $Level_{P2}$ of the common-mode voltage caused at the place "II".

A graph of FIG. 11B shows a result of measurement of the energy level of electromagnetic waves radiated from the three antennas, which was performed by changing the frequency of pulses inputted from an end of the signal line, which is at the side of the plate P0 shown in FIG. 11A. The axis of abscissas of this graph represents the frequency f [Hz] of the input pulse and is calibrated in 0.3-GHz increments. The axis of ordinate of this graph represents the radiation energy level and is calibrated in 10-dBμV increments.

The radiation energy levels respectively measured at the places "I" to "III" change with respect to the frequency f as illustrated in this graph. When the reference value is employed as an input value, the energy level difference at the maximum applicable frequency fx was read from this graph. At the place "I", the measured energy level difference from the input was −20 dBμV. At the place "II", the measured energy level difference from the level at the place "I" was −14.5 dBμV. At the place "III", the measured energy level difference from the level at the place "II" was −8 dBμV. These measured values were nearly comparable with the values of the common-mode voltage and the propagation values thereof, which were obtained by using the expressions (1-1) to (3), (6-1) and (6-2). Therefore, the high accuracy of the circuit board design verifying method according to this example was ensured.

According to the circuit board design verifying method according to this example, even in a case where there are a large number of portions having chippings, such as gaps, slots, and slits, which should be adjusted, in a circuit board, it can easily be decided which of the portions largely affects electromagnetic wave radiation. Therefore, the priorities of the defective portions, which should be adjusted, can be decided within a set time for designing a circuit board. The efficiency in verifying a circuit board design can be enhanced. Thus, the method embodying the invention can prevent an occurrence of a situation in which some defective portions of a circuit board, which generate a large quantity of electromagnetic wave radiation, are not adjusted within a set time for designing the circuit board. Moreover, the gap between the separated power supply plates can be detected. This prevents an occurrence of failure in detecting defective portions, which generate a large quantity of electromagnetic wave radiation, in a circuit board. Consequently, the quantity of electromagnetic wave radiation from the entire circuit board can be considerably reduced.

The propagation value of a common-mode voltage propagating to the connector, to which a preliminarily designated cable is connected, can be calculated. Moreover, the propagation value and the position of the connector can be displayed. Thus, the priorities of the defective portions, to which the countermeasures to suppress the electromagnetic wave radiation are applied, can easily be decided. Consequently, a circuit board having substantially no or extremely few portions, which serve as antennas for radiating electromagnetic waves, can efficiently be designed.

In the case that the circuit board design verifying apparatus according to this embodiment comprises a microcomputer, change of specifications, which is conducted for achieving calculations of common-mode voltages propagating to the connector and the propagation value thereof so as to obtain the above-described advantages, can be attained by changing control programs. Thus, the verifying apparatus of this embodiment does not require substantial change of the design process hitherto employed. Moreover, the design cost can be prevented from considerably increasing. On the contrary, the improvement of the efficiency in designing a circuit board is achieved to thereby considerably reduce the design cost.

Although the preferred embodiments of the present invention have been described above, it should be understood that the present invention is not limited thereto and that other modifications will be apparent to those skilled in the art without departing from the sprint of the invention. The scope of the present invention, therefore, should be determined solely by the appended claims.

What is claimed is:

1. A method for verifying a design of a circuit board having a wiring layer connecting components to be mounted, a power layer, and an insulating layer formed between said wiring layer and said power layer, comprising the steps of:

applying a voltage to a signal input of the wiring layer;

determining a voltage present at a signal output of the wiring layer; and assessing characteristics of the voltage at the signal output to detect whether there is chipping of said power layer.

2. The method for verifying a design of a circuit board, according to claim 1, wherein said step of detecting a chipping includes a step of detecting a kind of the chipping according to dimensions of the chipping, which respectively correspond to both sides of a direction of width of said wiring layer serving as a signal line, from a gap, a slot, and a slit.

3. The method for verifying a design of a circuit board, according to claim 2, further comprising computing the a common-mode voltage, wherein one of a plurality of computational expressions associated with the kinds of chippings and the dimensions is selected, and subsequently, an approximate value of the common-mode voltage is computed according to the selected computational expression.

4. The method for verifying a design of a circuit board, according to claim 1, which further comprises a step of making comparison between a common-mode voltage and a predetermined threshold and determining a signal line portion, which needs a countermeasure to suppress radiation of electromagnetic waves, in said wiring layer according to a result of the comparison.

5. The method for verifying a design of a circuit board, according to claim 4, which further comprises a step of computing a propagation value of the common-mode voltage, which is expected at the connector when the common-mode voltage exceeding the threshold propagates and reaches to the connector in a case where there is possibility of an occurrence of the common-mode voltage exceeding the threshold and that there is a portion, at which a cable-connection connector is to be mounted, on said circuit board.

6. The method for verifying a design of a circuit board, according to claim 5, which further comprises the steps of making comparison between said computed propagation value and the threshold and outputting, according to a result of the comparison between said computed propagation value and said threshold, a position of a mounting prearranged portion on which the connector is mounted, and at which there is possibility of an appearance of the propagation value exceeding the threshold, and also outputting the propagation value to be expected to appear at the mounting prearranged portion.

7. The method for verifying a design of a circuit board according to claim 1, further comprising outputting a position of the chipping and a value of the common-mode voltage caused owing to the chipping.

8. The method for verifying a design of a circuit board according to claim 1, further comprising listing countermeasures useable to counter the chipping on the power layer.

9. A method for verifying a design of a circuit board having a wiring layer connecting components to be mounted, a power layer, an insulating layer formed between said wiring layer and said power layer, and mounting prearranged parts, on which cable-connection connectors are mounted, comprising the steps of:

applying a voltage to a signal input of the wiring layer;

assessing characteristics of the voltage at a signal output of said wiring layer to detect whether there is chipping of said power layer;

computing, in a case that the chipping is detected, a propagation value of a common-mode voltage expected at a connector when the common-mode voltage generated at the chipping propagates and reaches the connector; and outputting, according to the computed propagation value, information representing whether or not a countermeasure for suppressing radiation of electromagnetic waves is applied to the connector or a cable connected to the connector.

10. The method for verifying a design of a circuit board, according to claim 9, wherein said step of detecting a chipping includes a step of detecting a kind of the chipping according to dimensions of the chipping, which respectively correspond to both sides of a direction of width of said wiring layer serving as a signal line, from a gap, a slot, and a slit.

11. The method for verifying a design of a circuit board according to claim 9, further comprising listing countermeasures useable to counter the chipping on the power layer.

12. An apparatus for verifying a design of a circuit board having a wiring layer connecting components to be mounted, a power layer, and an insulating layer formed between said wiring layer and said power layer, comprising:

means for applying a voltage to a signal input of the wiring layer;

determining portion for determining a voltage present a signal output of the wiring layer; and a detecting portion for assessing characteristics of the voltage of the signal output to detect whether there is chipping of said power layer.

13. The apparatus for verifying a design of a circuit board, according to claim 12, wherein said detecting portion detects a kind of the chipping according to dimensions of the chipping, which respectively correspond to both sides of a direction of width of said wiring layer serving as a signal line, from a gap, a slot and a slit.

14. The apparatus for verifying a design of a circuit board, according to claim 12, which further comprises a comparison/decision portion for making comparison between the common-mode voltage and a predetermined threshold value and for determining a signal line portion, which needs a countermeasure to suppress radiation of electronic waves, according to a result of the comparison, wherein said determining portion computes a propagation value of the common-mode voltage, which is expected at the a connector when the common-mode voltage exceeding the threshold propagates and reaches to the connector in a case where there is possibility of an occurrence of the common-mode voltage exceeding the threshold and that there is a portion, at which a cable-connection connector Is to be mounted, on said circuit board.

15. The apparatus for verifying a design of a circuit board, according to claim 14, wherein said comparison/decision portion further makes comparison between the computed propagation value and the predetermined threshold and determines the mounting prearranged portion of the connector, which has possibility that the propagation value exceeding the threshold occurs there, according to a result of the comparison between said computed propagation value and said predetermined threshold, and wherein said output portion outputs a position of said determined mounting prearranged portion and the propagation value associated with said mounting prearranged portion.

16. The apparatus for verifying a design of a circuit board according to claim 12, which further comprises an output portion for outputting a position of the chipping and a value of a common-mode voltage caused owing to the chipping.

17. An apparatus for verifying a design of a circuit board having a wiring layer connecting components to be mounted, a power layer, an insulating layer formed between said wiring layer and said power layer, and mounting prearranged parts, on which cable-connection connectors are mounted, comprising:

means for applying a voltage to a signal input of the wiring layer;

a determining portion for computing, in a case where the chipping is detected, a propagation value of a common-mode voltage expected at a connector when the common-mode voltage generated at the chipping propagates and reaches the connector; and a detecting portion for assessing characteristics of the voltage at a signal output said wiring layer to detect whether there is chipping of said power layer.

18. The apparatus for verifying a design of a circuit board according to claim 17, wherein said detecting portion detects a kind of the chipping according to dimensions of the chipping, which respectively correspond to both sides of a direction of width of said wiring layer serving as a signal line, from a gap, a slot, and a slit.

19. The apparatus for verifying a design of a circuit board according to claim 17, which further comprises a comparison/decision portion for making comparison between the computed propagation value and a predetermined threshold and for determining a mounting prearranged portion, which has possibility of an appearance of the propagation value exceed the threshold and which needs a countermeasure, according to a result of the comparison, wherein said determining portion outputs a position of said determined mounting prearranged portion and the propagation value associated with said mounting prearranged portion.

20. The apparatus for verifying a design of a circuit board according to claim 17, which further comprises an output portion for outputting, according to the computed propagation value, and information representing whether or not a countermeasure for suppressing radiation of electromagnetic waves is applied tote connector or a cable connected to the connector.

* * * * *